(12) United States Patent
Yamamoto

(10) Patent No.: US 7,102,759 B2
(45) Date of Patent: Sep. 5, 2006

(54) OPTICAL DISPLACEMENT SENSOR AND OPTICAL ENCODER

(75) Inventor: Eiji Yamamoto, Ome (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/075,439

(22) Filed: Mar. 8, 2005

(65) Prior Publication Data

US 2005/0162661 A1    Jul. 28, 2005

Related U.S. Application Data

(62) Division of application No. 09/480,506, filed on Jan. 10, 2000, now Pat. No. 7,064,842.

(30) Foreign Application Priority Data

Jan. 13, 1999 (JP) ............... 11-006411
Dec. 21, 1999 (JP) ............... 11-362940

(51) Int. Cl.
*G01B 9/02* (2006.01)

(52) U.S. Cl. .................... 356/499

(58) Field of Classification Search .......... 356/498, 356/499, 488, 494, 521; 250/237 G, 231.14
See application file for complete search history.

(56) References Cited

U.S. PATENT DOCUMENTS

| | | | |
|---|---|---|---|
| 5,064,290 A | 11/1991 | McMurtry et al. |
| 5,214,280 A | 5/1993 | Rieder et al. |
| 5,424,833 A | 6/1995 | Huber et al. |
| 5,671,052 A | 9/1997 | Kawakubo et al. |
| 5,680,211 A | 10/1997 | Kaneda et al. |
| 6,201,239 B1 | 3/2001 | Yamamoto et al. |
| 6,445,456 B1 | 9/2002 | Speckbacher et al. |
| 6,486,467 B1 | 11/2002 | Speckbacher et al. |
| 6,631,005 B1 | 10/2003 | Komazaki et al. |
| 2005/0157307 A1 | 7/2005 | Yamamoto et al. |

OTHER PUBLICATIONS

Copal: Rotary Encoder Catalog; p. 3.
E. Yamamoto; "Ultra Small Sensor Using a Surface Emitting Laser"; Lecture Materials (VI) for Machinery Institute, 75th Periodic General Meeting; 1998; pp. 682-689.

*Primary Examiner*—Hwa (Andrew) Lee
(74) *Attorney, Agent, or Firm*—Frishauf, Holtz, Goodman & Chick, P.C.

(57) ABSTRACT

An optical displacement sensor comprises a surface emitting laser light source, a scale and a photosensor. The surface emitting laser light source emits a light beam having a predetermined shape. The scale is displaceable in such a manner as to cross the light beam emitted from the surface emitting laser light source and has a diffraction grating of a predetermined period formed thereon for forming a diffraction interference pattern from the light beam. The photosensor receives a predetermined portion of the diffraction interference pattern. The photosensor includes light intensity detecting means comprised of a plurality of light receiving areas arranged apart from one another in a pitch direction of the diffraction interference pattern on a light receiving surface at intervals of $np1(z1+z2)/z1$ where $z1$ is a distance between a light-beam emitting surface of the surface emitting laser light source and a surface on which the diffraction grating is formed, $z2$ is a distance between the surface on which the diffraction grating is formed and the light receiving surface of the photosensor, $p1$ is the pitch of the diffraction grating on the scale, and $n$ is a natural number.

5 Claims, 26 Drawing Sheets

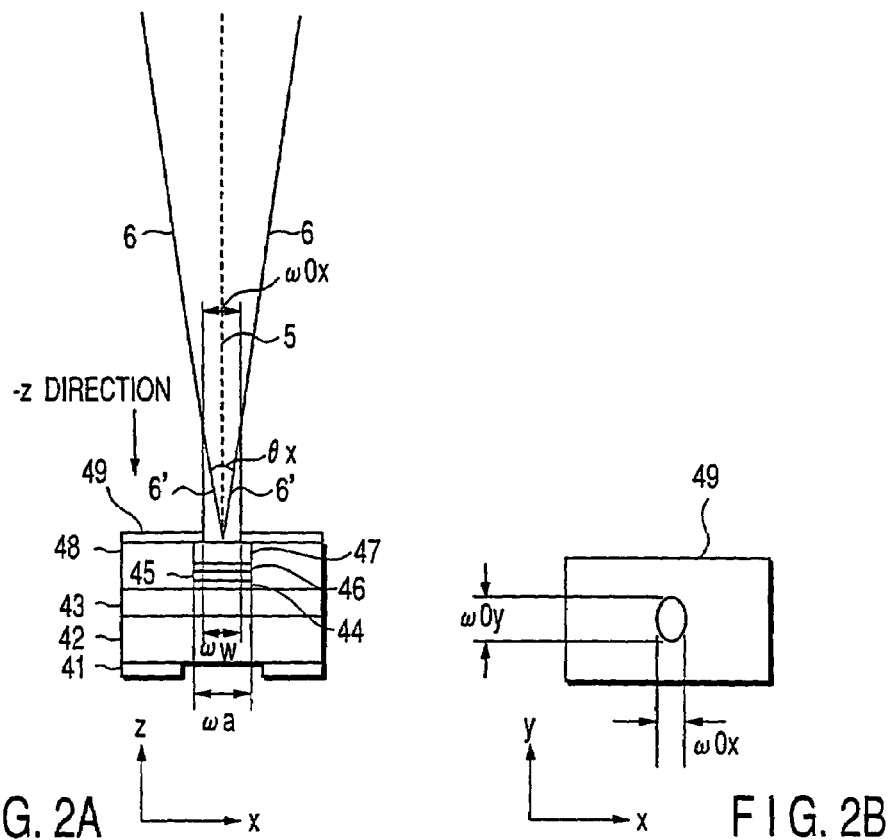
FIG. 2A
FIG. 2B
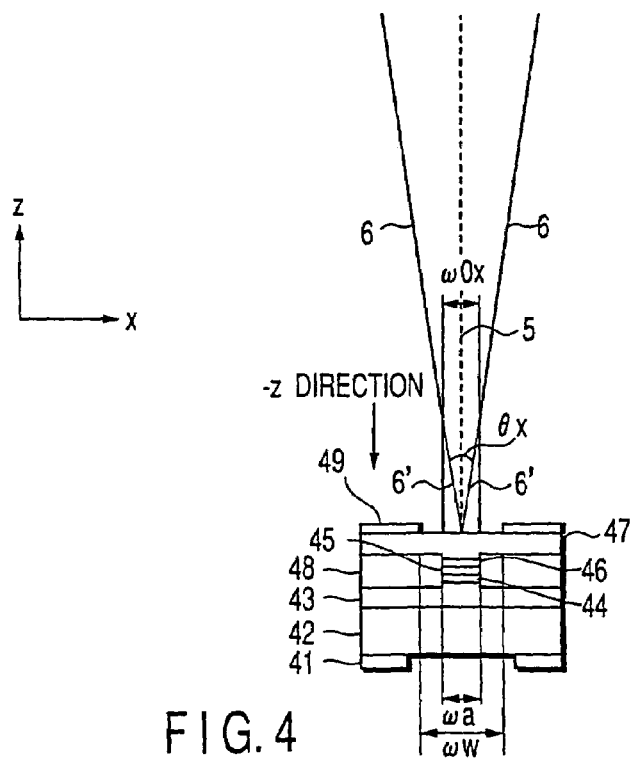
FIG. 4

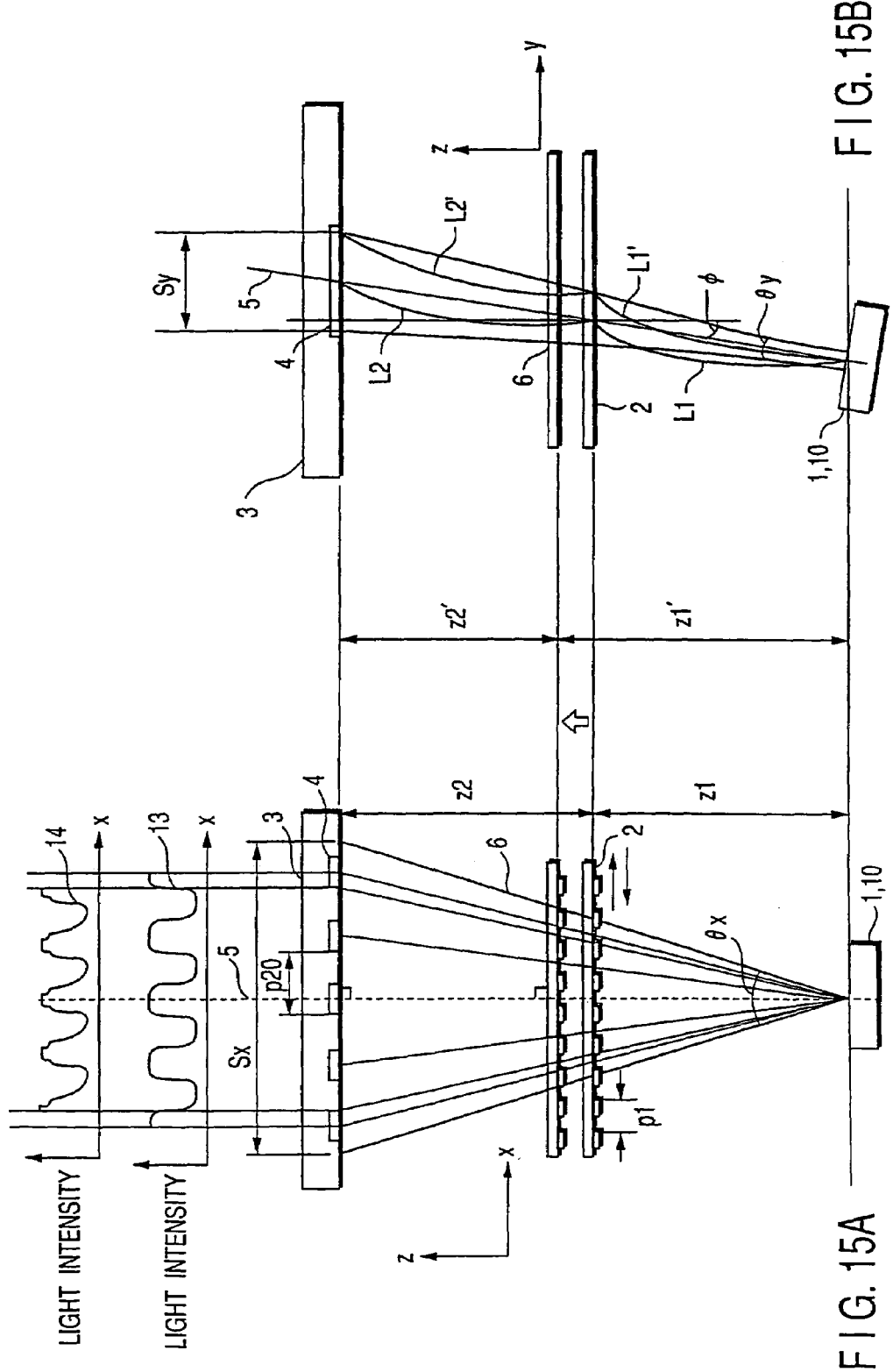

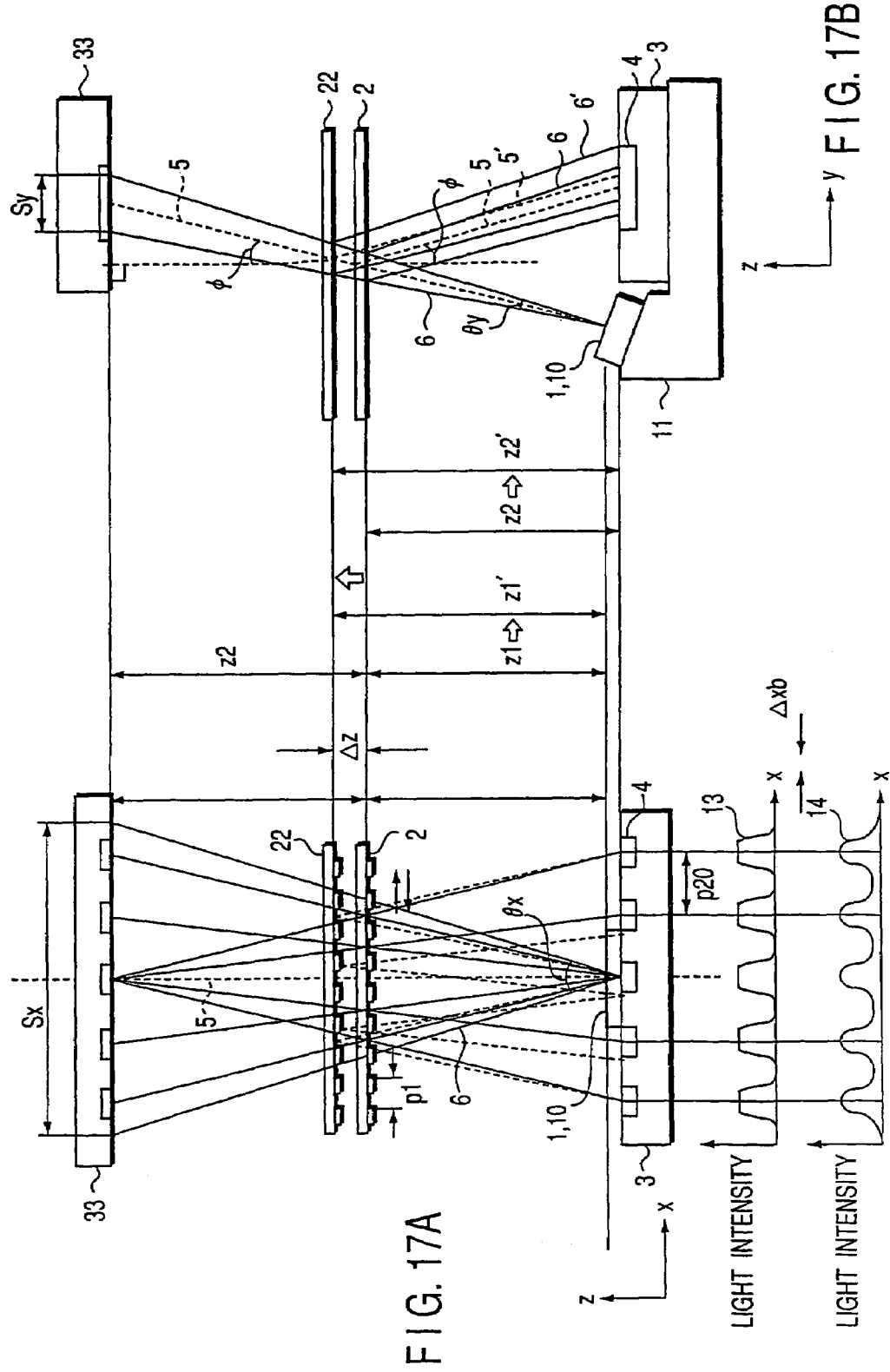

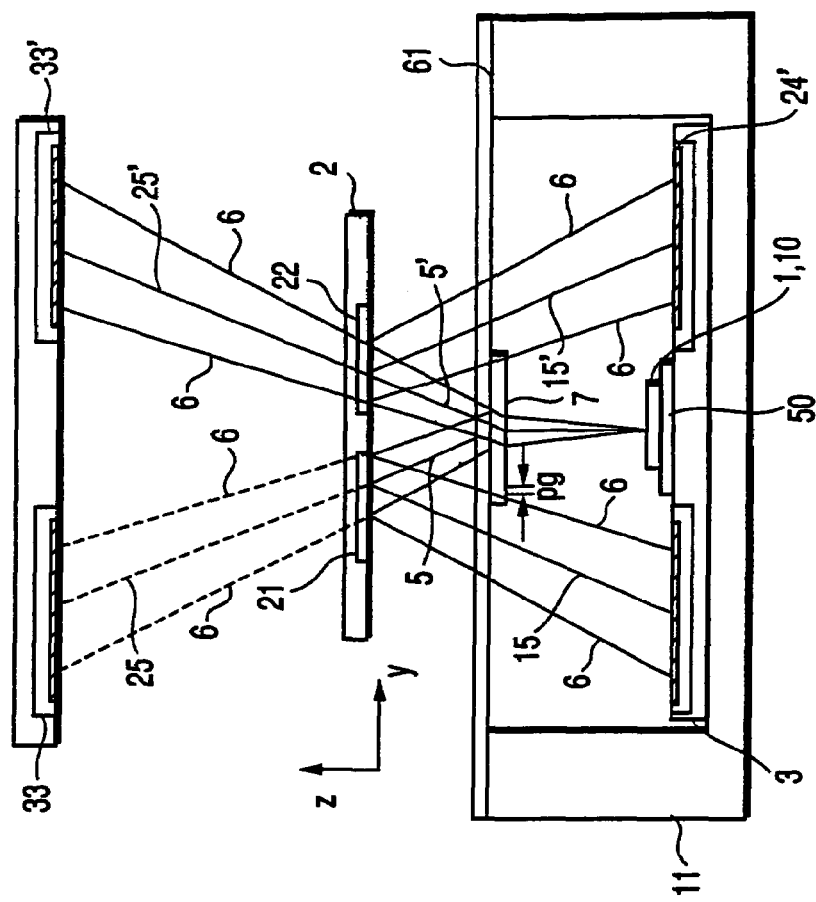
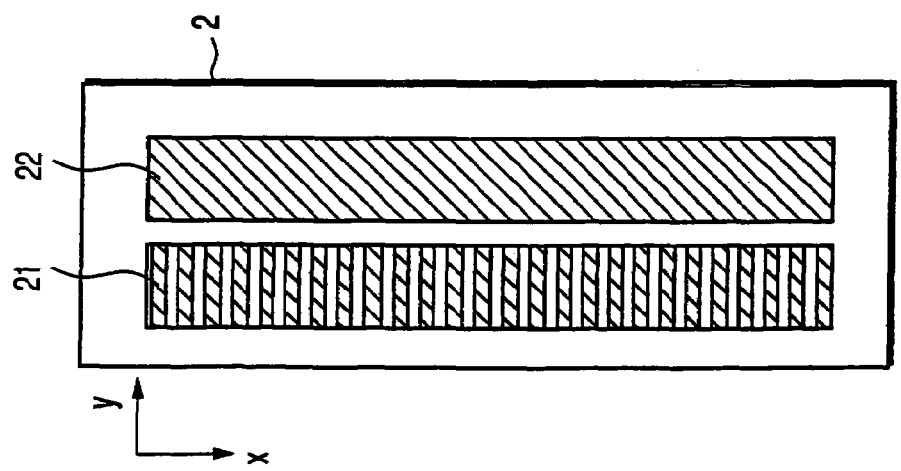
FIG. 20B
FIG. 20A

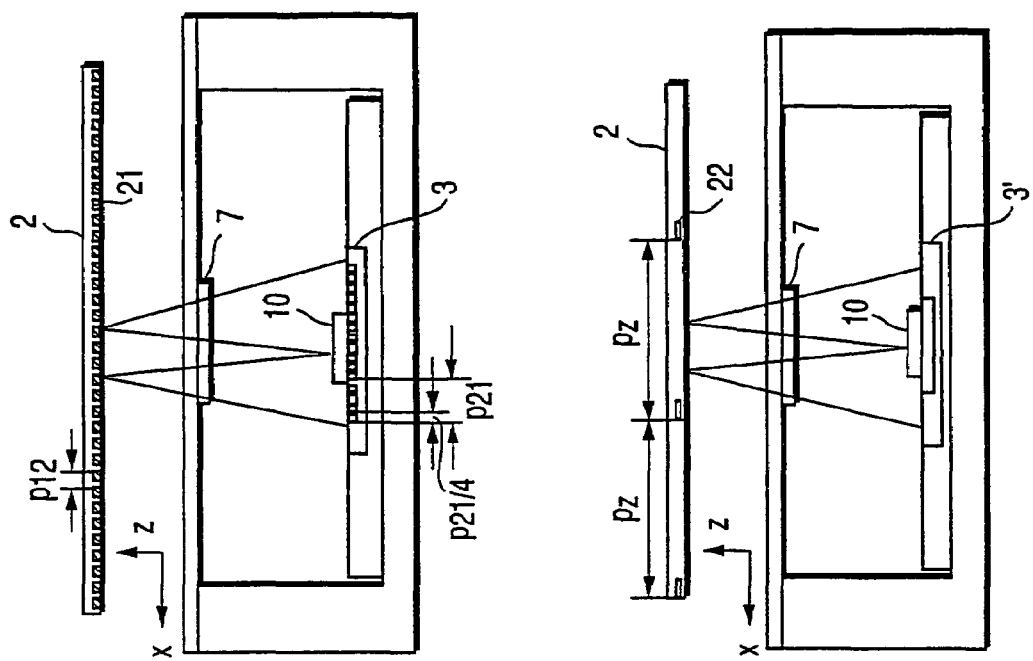
FIG. 23B
FIG. 23C
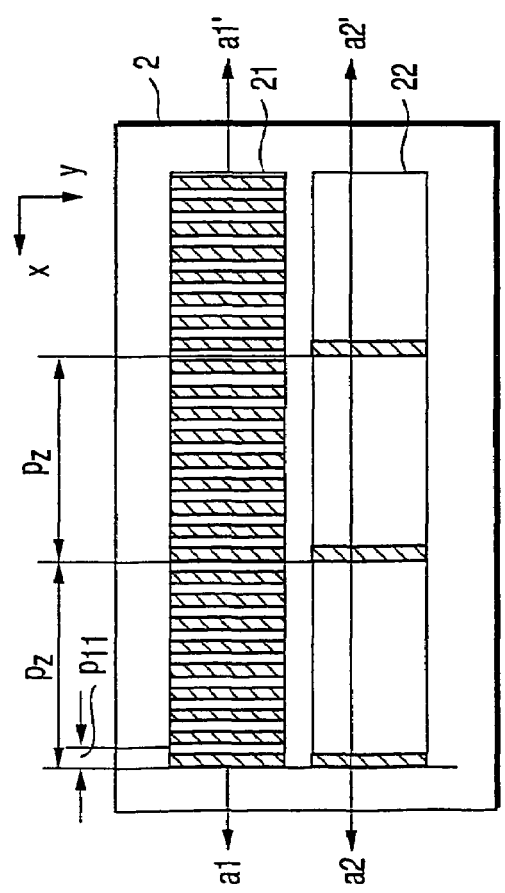
FIG. 23A

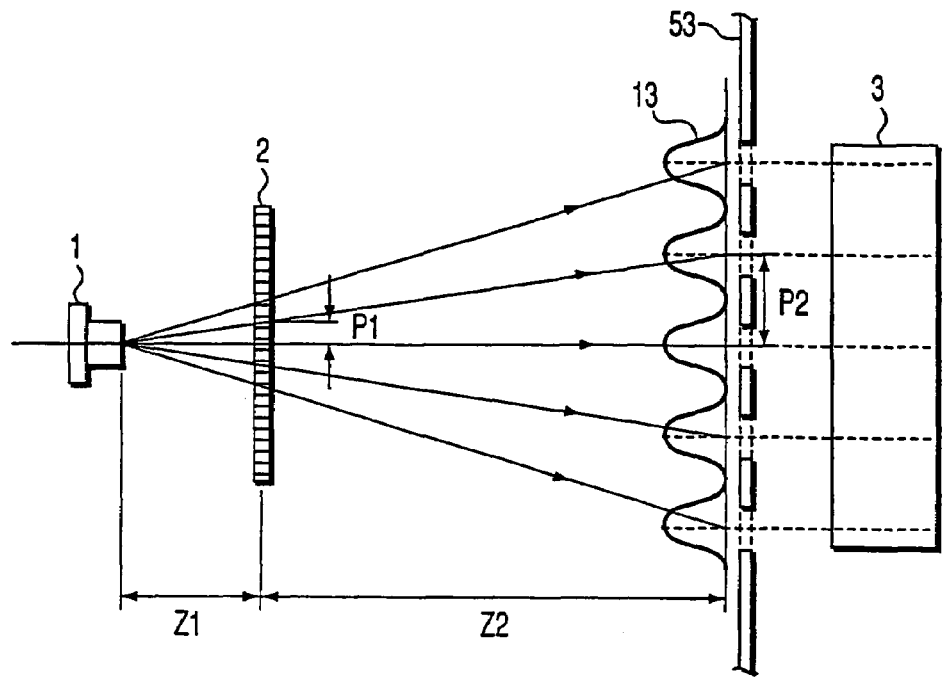
F I G. 28 PRIOR ART
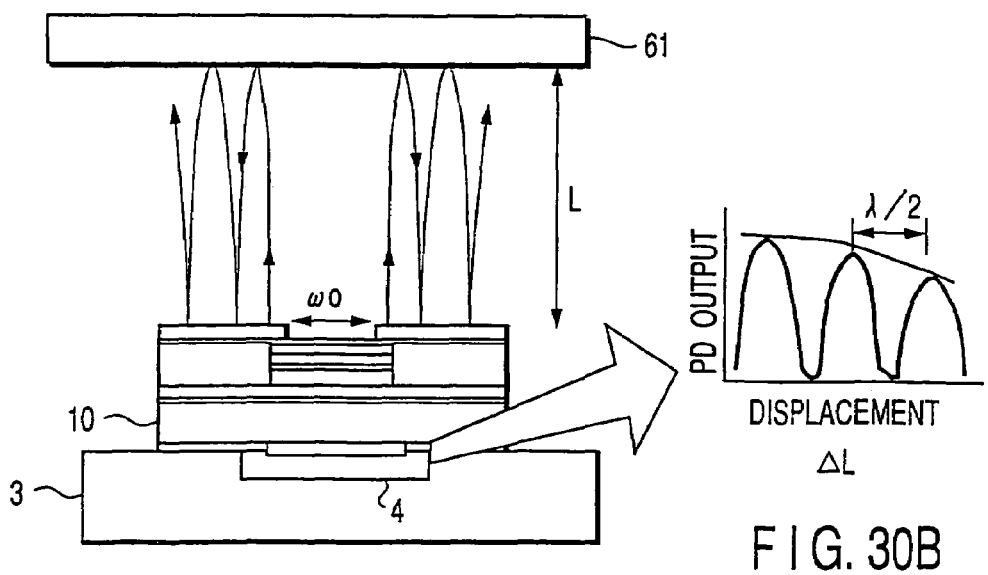
F I G. 30A
PRIOR ART
F I G. 30B
PRIOR ART

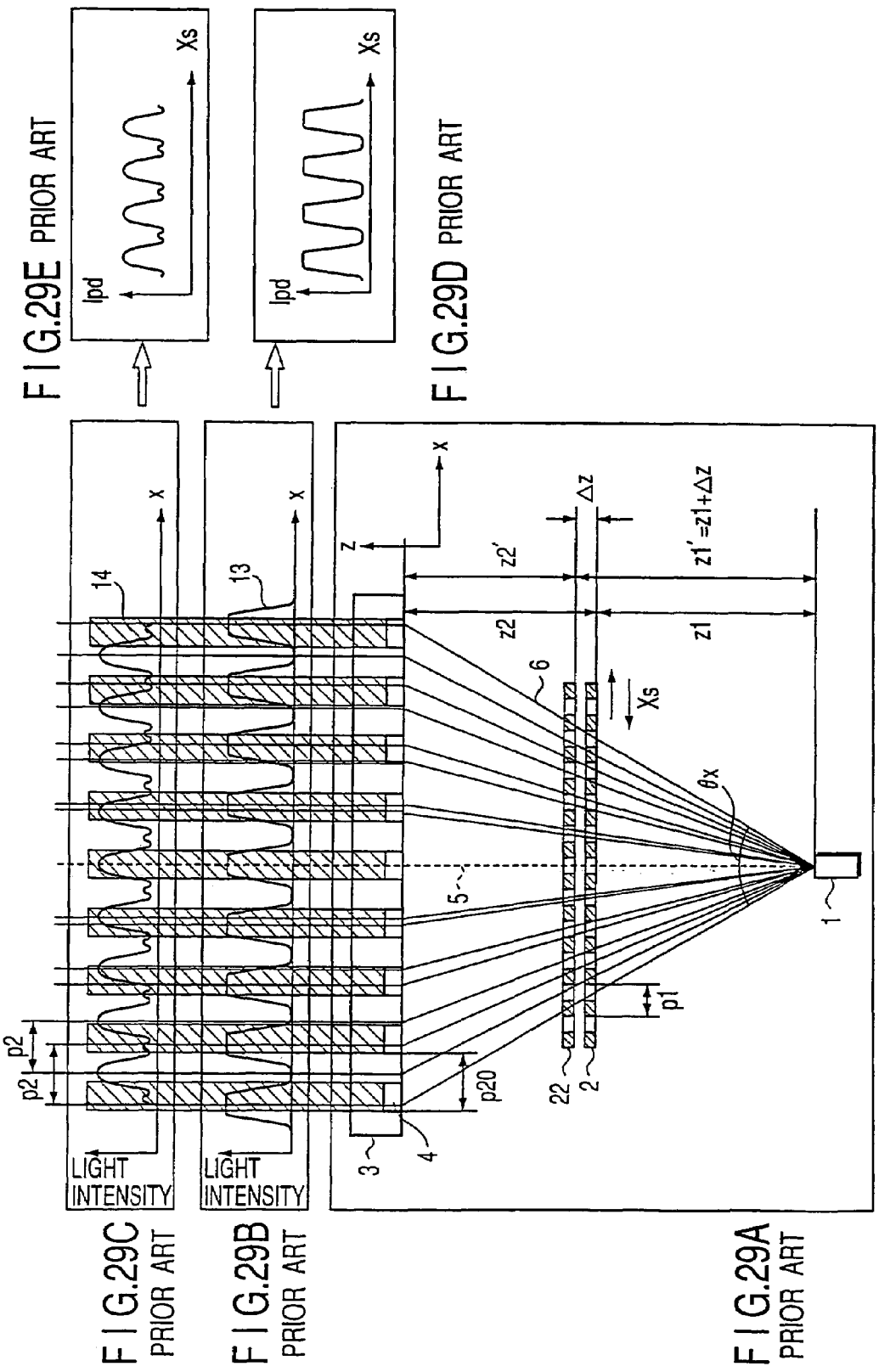

OPTICAL DISPLACEMENT SENSOR AND OPTICAL ENCODER

CROSS-REFERENCE TO RELATED APPLICATIONS

The present application is a Divisional Application of U.S. application Ser. No. 09/480,506, filed Jan. 10, 2000, now U.S. Pat. No. 7,064,842, which is based upon and claims the benefit of priority from the prior Japanese Patent Applications No. 11-006411, filed Jan. 13, 1999, and No. 11-362940, filed Dec. 21, 1999. The entire contents of parent application Ser. No. 09/480,506 are incorporated herein by reference.

BACKGROUND OF THE INVENTION

The present invention relates to an optical displacement sensor and an optical encoder and, more particularly, to an optical displacement sensor for detecting the displaced amount of a precision mechanism.

The general structure of an encoder, which is a typical conventional displacement sensor as a first prior art, will be described first. FIG. 28 shows the structure of a conventional laser encoder using a coherent light source and a diffraction grating scale as an example of a miniaturized low cost encoder that does not require assembly of optical parts such as a lens.

A laser encoder using a coherent light source and a diffraction grating scale is described in, for example, "Copal: Rotary encoder catalogue". As shown in FIG. 28, the laser encoder is constructed such that a laser beam emitted from a semiconductor laser constituting a coherent light source 1 is irradiated on a transmission type diffraction grating scale 2 to form a diffraction interference pattern 13. A specific portion of the diffraction interference pattern 13 thus formed passes through transmission slits 53 located at predetermined distances P2 so as to be detected by a photosensor 3.

FIGS. 29A to 29E show in detail the operation of the displacement sensor using the laser encoder, which is shown in FIG. 28.

First of all, the operation of the conventional displacement sensor shown in FIG. 28 will be described with reference to FIGS. 29A to 29E. The individual structural parameters shown in FIG. 29A are defined as follows:

z1: distance between the light source 1 and the surface of the scale 2 on which the diffraction grating is formed;

z2: distance between the surface of the scale 2 on which the diffraction grating is formed and the light receiving surface of the photosensor;

p1: pitch of the diffraction grating on the scale 2;

p2: pitch of a diffraction interference pattern 13 on the light receiving surface of the photosensor 3;

θx: spread angle of the light beam emitted from the light source toward the pitch of the diffraction grating on the scale 2; and θy: spread angle of the light beam emitted from the light source in a direction perpendicular to the spread angle θx (the spread angle of the light beam represents an angle made by a pair of boundary lines 6 at which the intensity of the light beam becomes a half in a direction in which the intensity of the light beam forms a peak).

It should be noted that the "pitch of the diffraction grating on the scale 2" represents the spatial period of a pattern formed by modulating the optical characteristics formed on the scale 2. Also, the "pitch of the diffraction interference pattern 13 on the light receiving surface of the photosensor 3" represents the spatial period of the intensity distribution of the diffraction interference pattern 13 formed on the light receiving surface.

According to the diffraction theory of light, an intensity pattern similar to the diffraction grating pattern of the scale 2 is formed on the light receiving surface of the photosensor 3, if z1 and z2 defined as above meet the relationship given below:

$$(1/z1)+(1/z2)=\lambda/kp1^2 \qquad (1)$$

where $\lambda$ is the wavelength of the light beam emitted from the light source, and k is an integer.

In this case, the pitch p2 of the diffraction interference pattern 13 on the light receiving surface can be expressed by an equation (2) given below by using the other structural parameters:

$$p2=p1(z1+z2)/z1 \qquad (2)$$

If the scale 2 is displaced with respect to the light source 1 in the pitch direction of the diffraction grating, the intensity distribution of the diffraction interference pattern 13 is moved in the direction of displacement of the scale while maintaining the same spatial period.

Therefore, if the spatial period p20 of a light receiving area 4 of the photosensor 3 is set at a value equal to that of p2, a periodic intensity signal is obtained every time the scale 2 is moved by p1 in the pitch direction, making it possible to detect the amount of displacement of the scale 2 in the pitch direction.

A prior art relating to a small displacement sensor using a surface emitting laser light source will now be described as a second prior art.

The small displacement sensor is a complex resonator type interference sensor using a surface emitting laser light source, which is disclosed in a paper by the present inventors, entitled "Ultra small sensor using a surface emitting laser" by Eiji Yamamoto, Lecture Materials (VI) for Machinery Institute 75th Periodic General Meeting, 1998, pp. 682–689.

As shown in FIGS. 30A and 30B, this small displacement sensor has a surface emitting laser light source 10 and an outer mirror 61 positioned to face each other so as to constitute a complex resonator. The light emitted from the surface emitting laser light source 10 is detected by the light receiving area 4 formed in the photosensor 3 so as to detect a change in the distance L between the surface emitting laser light source 10 and the outer mirror 61.

According to this paper, the output characteristics of the sensor when the distance L is changed depend on many structural parameters. However, typical examples of calculation are shown in the case of using an edge emitting type semiconductor laser which is an ordinary conventional semiconductor laser widely used (FIG. 31A), in comparison with the use of a surface emitting laser (FIG. 31B).

According to the paper, when an edge emitting type semiconductor laser is used as the light source, the laser output is scarcely changed regardless of a change in the distance L between the light source and the outer mirror, if the distance L is at least several scores of μm. When a surface emitting laser is used as the light source, by way of contrast, a slight change in the distance L greatly changes the laser output even if the light source and the outer mirror are positioned apart from each other by over several millimeters.

The paper also teaches that, even in the case of using a surface emitting laser as the light source, the laser output is scarcely changed regardless of a change in the distance L, if the distance L is set relatively large by inclining the outer mirror facing the light source.

FIG. 31C shows the characteristics in the case where the outer mirror is inclined by 0.5° with the structure similar to that shown in FIG. 31B. As also apparent from FIG. 31C, it is known that a change in the laser output with respect to a change in the distance L can be suppressed by further tilting the outer mirror even if the distance L is small.

Let us consider the case where z1 and z2 deviate from the relationship given by the equation (1) because of an initial misalignment in assembling the sensor and the mechanical swinging caused by the displacement of the scale in the prior arts shown in FIGS. 28 and 29A to 29E.

For example, where the scale position is deviated by $\Delta z$ from the position of the scale 2 to the position of a scale 22 as shown in FIG. 29A, though the light source and the light receiving surface are fixed, the diffraction interference pattern on the light receiving surface is disturbed as shown in FIGS. 29B and 29C as well as the pitch p2 of the diffraction interference pattern 13 on the light receiving surface is changed according to the equation (2).

It is to be noted that the expression "the diffraction interference pattern 13 on the light receiving surface is disturbed" implies that the similarity of the diffraction interference pattern 13 on the light receiving surface to the diffraction grating pattern of the scale 2 is disturbed.

In the conventional structures shown in FIGS. 28 and 29A to 29E, z1 is z1+$\Delta z$ and z2 is z2−$\Delta z$ in the ordinary case where the arrangement of the light source 1 and the photosensor 3 is fixed.

Let us now consider the case where the scale surface and the light receiving surface are arranged in parallel.

If the pitch of the interference pattern formed on the light receiving surface is changed from p2 to p2' when a positional deviation $\Delta z$ has taken place, the following equation (3) is satisfied:

$$p2'=p1(z1+\Delta z+z2-\Delta z)/(z1+\Delta z)=p1(z1+z2)/(z1+\Delta z) \quad (3)$$

Therefore, if a plurality of light receiving regions 4 of the photosensor 3 are formed in accordance with the period of the pitch p2, a deviation between the period of the light receiving region and the period of the diffraction interference pattern 13 is increased at the position away from the principal axis of the beam from the light source. As a result, as shown in FIGS. 29D and 29E, it is inevitable that the amplitude of the output signal Ipd from the photosensor is lowered and the diffraction interference pattern 13 is disturbed.

Suppose that z1=0.5 mm, z2=0.5 mm and $\Delta z$=−z1/10=0.05 mm. In this case, p2=20 μm and p2'=22.2 μm are obtained from an equation (3).

Therefore, even if the pitch of the light receiving area 4 is set at p20=p2=20 μm as designed, 4.5p2≠4.0p2' at the position away from the principal axis of the light beam on the light receiving surface by Sx/2=4.5p2=90 μm, with the result that the diffraction interference pattern 13 is deviated by ½ pitch. It follows that a signal 14 output from the light receiving area 4 at this position bears a reversed phase, leading to reduction in the amplitude of the output from the sensor.

In this case, the phase of the diffraction interference pattern 13 is reversed on the light receiving surface at the position where the apparent angle θ when viewed from the light source becomes 2 ArcTan(4.5p2/(z1+z2))=10.3°. With this angle taken as the maximum apparent angle θmax, it is desirable to set the distribution width Sx of the light receiving area 4 at a value corresponding to about half of θmax representing the maximum apparent angle and also to set the beam spread angle of the coherent light at about θmax.

The distribution width Sx of the light receiving area noted above implies the entire expansion where the aforementioned plural light receiving regions are distributed.

To be more specific, in order to suppress the reduction in the amplitude of the output signal Ipd caused by the positional deviation of the scale and a variation in the assembling step of the sensor and to obtain the appropriate light receiving level, it is effective to limit the distribution width Sx of the light receiving area to an area in the vicinity of the principal axis of the light beam and to use a coherent light source having a spread angle of the light beam corresponding to the distribution width.

Under the circumstances, in the case of the conventional structure which uses an edge emitting type semiconductor laser as the light source, the spread angle of the light beam is very large, i.e., about 40° along the longer axis and about 20° along the shorter axis, making it difficult to emit a laser beam having a beam spread angle θmax of about 10°. What should be noted is that most of the laser beam spread by an angle larger than the θmax of about 10° causes a significant reduction in the amplitude of the sensor output or leads to a lower light receiving level.

Such being the situation, what is required is a sensor using a coherent light as the light source that permits the spread angle of the laser beam emitted from the light source to be set appropriately.

Further, even if the light receiving area is limited to a region in the vicinity of the principal axis of the light beam, it is unavoidable for the period of the output signal Ipd to change, leading to an error in the measurement of the absolute value in the amount of displacement of the scale.

The requirement to suppress the change in the period of the output signal Ipd when a positional deviation $\Delta z$ ($\Delta z$ means a gap variation between the scale and the head) has taken place in the scale is the structure that does not bring about a change in the period of the diffraction interference pattern on the light receiving surface.

Another problem inherent to the prior art is that the light emitted from the laser light source is reflected on the surfaces of the scale and the photosensor so as to return to the laser light source, which results in a change in the light intensity occurs, leading to noise generation in the output signal.

A measure against the difficulty is essential particularly in a case where a laser having a small beam spread angle such as a surface emitting laser is used as the light source, as already described in conjunction with the second prior art. For suppressing the difficulty, it is necessary to provide the structure that can lower the noise caused by the returning laser light beam.

The following is the summary of the shortcomings of the above-described prior arts and the subject matters of this invention to cope with the shortcomings.

As the prior arts use a conventional semiconductor laser as the light source, the spread angle of the light beam is very large, i.e., about 40° in the direction of the longer axis and about 20° in the direction of the shorter axis. In addition, it is impossible to set the spread angle of the light beam as desired. Therefore, if the expansion of the light receiving area is limited to a region in the vicinity of the principal axis of the light beam, the power of the light incident to the light receiving area is remarkably lowered, resulting in failure to solve the problem that the S/N ratio of the signal is lowered.

A first subject matter of this invention, which has been achieved in view of the situation described above, is to provide the structure that permits setting the spread angle of the light beam to be set to a predetermined small angle that cannot be achieved by the conventional semiconductor laser light source and to realize an optical displacement sensor that provides an output signal of a good S/N ratio even if the arrangement of the light source, the scale and the light receiving element deviates from the optimum arrangement.

In the prior arts, the surface of the scale and the light receiving surface of the photosensor are arranged perpendicular to the principal axis of the light beam emitted from the laser light source. As a result, the light emitted from the laser light source is reflected on the surfaces of the scale and the photosensor so as to return to the laser light source, thus generating noise.

A second subject matter of this invention, which has been achieved in view of this situation, is to provide an optical displacement sensor that prevents the laser light from returning to the light source to be thereby able to suppress the superimposition of the noise caused by the returning laser light on the output signal of the sensor.

Further, in the case where the arrangement of the light source, the scale and the light receiving element deviates from the designed layout in the prior art, the period and the position of the diffraction interference pattern on the light receiving surface are greatly changed, resulting in a failure to suppress the reduction in the amplitude of the signal and the change in the period with respect to the scale displacement.

A third subject matter of this invention, which has been achieved in view of this situation, is to provide an optical displacement sensor capable of reducing changes in the period and position of the diffraction interference pattern on the light receiving surface and also capable of suppressing the reduction of the signal amplitude and change in the period with respect to the scale displacement.

Furthermore, this invention is directed to a fourth subject matter in addition to the first to third subject matters described previously.

Specifically, the fourth subject matter of this invention is to provide an encoder that has the reference point detecting function and the absolute point detecting function and also can accurately detect the displacement of the scale in the x direction while being scarcely affected by the change in the gap between the scale and the head.

A fifth subject matter of this invention is to reduce the assembling cost by employing a mounting mode that does not use an inclined substrate.

Further, a sixth subject matter of this invention is to provide a structure and means that stabilize the encoder output signal in spite of a change in the environment.

BRIEF SUMMARY OF THE INVENTION

Accordingly, it is an object of this invention, which is particularly intended to achieve the first to third subject matters described above, to provide an optical displacement sensor, which permits the spread angle of the light beam to be set at an angle not larger than a predetermined value that cannot be achieved in the conventional semiconductor laser light source, which prevents laser light capable of producing an output signal of a good S/N ratio from returning to the light source even when the arrangement of the light source, the scale and the light receiving element is deviated from the optimum arrangement (when the gap between the light source and the scale is varied, for example) so as to suppress the superimposition of noise caused by the returning laser light on the output signal of the sensor, and which reduces changes in the period and position of the diffraction interference pattern on the light receiving surface so as to suppress reduction in the signal amplitude and a change in the period with respect to the scale displacement.

It is another object of this invention, which is particularly intended to achieve the fourth to sixth subject matters described above, to provide an optical encoder that can be used as an optical displacement sensor, which has a reference point detecting function and an absolute point detecting function so as to accurately detect the displacement of the scale in an x direction while being hardly affected by the change in the gap between the scale and the head, and which has a structure and means for reducing the assembling cost and for stabilizing the encoder signal output regardless of a change in the environment by employing a mounting mode that does not use an inclined substrate.

To achieve the first subject matter, according to a first aspect (1) of this invention, there is provided an optical displacement sensor comprising:

a surface emitting laser light source for emitting a light beam having a predetermined shape;

a scale displaceable in such a manner as to cross the light beam emitted from the surface emitting laser light source and having a diffraction grating of a predetermined period formed thereon for forming a diffraction interference pattern from the light beam; and a photosensor for receiving a predetermined portion of the diffraction interference pattern, the photosensor including light intensity detecting means comprised of a plurality of light receiving areas arranged apart from one another in a pitch direction of the diffraction interference pattern on a light receiving surface at intervals of $np1(z1+z2)/z1$ where $z1$ is a distance between a light-beam emitting surface of the surface emitting laser light source and a surface on which the diffraction grating is formed;

$z2$ is a distance between the surface on which the diffraction grating is formed and the light receiving surface of the photosensor;

$p1$ is a pitch of the diffraction grating on the scale; and $n$ is a natural number.

(Corresponding Embodiment of Invention)

The first aspect (1) of the invention corresponds to a first embodiment of this invention.

While a vertical resonance type surface emitting laser is described mainly in this embodiment as the surface emitting laser used in the first aspect (1) of the invention, the surface emitting laser should include a surface emitting laser formed by integrating an edge emitting type semiconductor laser and an optical waveguide, a rising mirror or a diffraction grating.

The "diffraction grating of a predetermined period for forming a diffraction interference pattern" in this structure means a diffraction grating having a periodic modulated pattern of optical characteristics such as the amplitude and phase formed thereon and should cover every diffraction grating including a reflection type diffraction grating for forming a diffraction interference pattern on the light receiving surface and a transmission type diffraction grating.

Also, the "light intensity detecting means comprised of a plurality of light receiving areas" used herein implies a photosensor so constructed as to add the outputs of the plural light receiving areas arranged at intervals of $np1(z1+z2)/z1$ in the pitch direction of the diffraction interference pattern on the light receiving surface and output the sum and should include a special case where the light intensity detecting means has only one light receiving area.

The value of n that determines the distance between the individual light receiving areas should not necessarily be constant over the entire region.

Further, the displacement sensor performs its function even if the distance between the individual light receiving areas is slightly deviated from the numerical condition "np1(z1+z2)/z1" included in the expression "the plural light receiving areas arranged at intervals of np1(z1+z2)/z1 in the pitch direction of the diffraction interference pattern". Even if there is a deviation of about ±30% from the numerical condition "np1(z1+z2)/z1" in working the first aspect (1) of the invention, therefore, the sensor should be construed to be encompassed within the scope of the first aspect (1) of the invention.

(Operation)

According to the optical displacement sensor (1) of the first aspect of the invention, the diffraction grating on the scale causes the laser light emitted from the surface emitting laser to form a diffraction interference pattern having a predetermined period p1(z1+z2)/z1 on the light receiving surface of the photosensor.

It should be noted that, since the light receiving areas constituting the light intensity detecting means of the photosensor are formed apart from one another in the pitch direction of the diffraction grating at intervals of np1(z1+z2)/z1, each light receiving area detects only a specific portion of the same phase in the diffraction interference pattern on the light receiving surface.

When the scale is displaced by x1 in the pitch direction of the diffraction grating, the scale is displaced by x2=x1(z1+z2)/z1 in the same direction on the light receiving surface in the diffraction interference pattern. Therefore, an output signal changing with a periodic intensity is acquired from the light intensity detection means every time the scale is moved by 1 pitch in the pitch direction of the diffraction grating.

The function of the surface emitting laser light source will now be described more specifically.

FIG. 2A is a cross sectional view schematically showing a surface emitting laser, and FIG. 2B is a top view as viewed from a z direction shown in FIG. 2A.

The surface emitting laser shown in FIG. 2A is constructed as described below. Specifically, formed on an N—GaAs substrate 42 is a lamination of an n-AlGaAs/GaAs semiconductor multi-layer mirror 43, an n-AlGaAs spacer layer 44, an InGaAs quantum well active layer 45, a p-AlGaAs spacer layer 46, and a p-AlGaAs/GaAs semiconductor multi-layer mirror 47 disposed in the named order. Further, a semi-insulating GaAs current blocking layer 48 is buried in a region other than the laser resonator from the surface to the n-AlGaAs spacer layer 44 in depth.

The resonator has a diameter ωa and the window through which laser light emerges has a diameter ωw. The surface shown in FIG. 2A is defined as an xz surface, and the surface shown in FIG. 2B is defined as an xy surface. Further, the spread sizes of the light beam on the light emitting surface of the surface emitting layer are defined as ωox and ωoy in the x and y directions, respectively.

For the sake of descriptive simplicity, the pitch direction of the diffraction grating on the scale is assumed to be the x direction in the description of the function in this specification. Also, the surface emitting laser emits a light beam having a principal axis 5, and the beam boundary at which the light intensity becomes half the intensity on the principal axis is represented by a curve 6.

As shown in FIG. 2A, the angles that are formed by tangential lines 6' tangential to the aforementioned beam boundary curve 6 at a distance and relative to the principal axis of the light beam are respectively called spread angles θx and θy of the light beam in the x direction and y direction.

For a surface emitting laser, for example, in the case of FIG. 2A, as the sizes ωox and ωoy are changed by freely setting the dimensions of the light emerging window of the device, θx and θy can be set in a wide range for the diffraction of the light beam.

FIG. 3 shows the experimental results that have been obtained by evaluating the relationship between the beam size on the light emitting surface of the surface emitting laser and the beam spread angle θ of a prototype prepared, and shows that setting the beam spread angle in a wide range is possible.

It is apparent that the beam size of 3 μm or greater leads to small beam spreading and is a good condition.

The beam size ωo on the light emitting surface can be roughly considered as either the diameter ωa of the resonator or the diameter of the light emerging window ωw, whichever is smaller.

When ωa>ωw as shown in FIG. 2A, therefore, the beam size ωo can be taken approximately as ωw.

When ωa<ωw for another surface emitting laser as shown in FIG. 4, the beam size ωo can be taken approximately as ωa.

According to the first aspect (1) of the invention, therefore, even if the spread of the light receiving area in the x direction is limited to an area in the vicinity of the principal axis of the light beam from the light source by using the surface emitting laser 10 as the light source instead of the edge emitting type semiconductor laser 1 which has been used in the conventional encoders, it is possible to set the beam spread angle corresponding to the narrow spreading of the light receiving area by properly setting ωox of the surface emitting laser. This can allow a diffraction interference pattern to be formed in the light receiving area by effectively using the light beam emitted from the light source.

Accordingly, the optical displacement sensor provided can output an output signal with an excellent signal amplitude and an excellent S/N ratio even if the arrangement of the light source, the scale and the light receiving element is deviated from the optimal one.

Because light need not have a diffraction interference in a direction perpendicular to the pitch of the diffraction grating in order to miniaturize the sensor, as small a beam spread angle as possible is desirable.

To prevent the output signal from being affected by a defect or dust in the diffraction grating on the scale, on the other hand, it is desirable to set the beam spread angle as large as possible.

To achieve the second subject matter, according to a second aspect (2) of this invention, the optical displacement sensor as described in the section (1) is characterized in that the photosensor has second light intensity detecting means having an output terminal independent from that of the light intensity detecting means, and the second light intensity detecting means has a light receiving width of mp1(z1+z2)/z1 in the pitch direction of the diffraction interference pattern on the light receiving surface where m is a second natural number which can be set independently of the natural number n.

(Corresponding Embodiment of Invention)

The second aspect (2) of the invention corresponds to second to fourth embodiments of this invention.

Further, the displacement sensor performs its function even if the distance between the individual light receiving areas is slightly deviated from the numerical condition "$mp1(z1+z2)/z1$" included in the expression "the second light intensity detecting means has a light receiving width of $mp1(z1+z2)/z1$ in the pitch direction of the diffraction interference pattern". Even if there is a deviation of about ±30% from the numerical condition "$mp1(z1+z2)/z1$" in working the second aspect (2) of the invention, therefore, the sensor should be construed to be encompassed within the scope of the second aspect (2) of the invention.

(Operation)

In addition to the feature of the first aspect (1) of the invention, the second aspect (2) of the invention has a feature such that the diffraction interference pattern on the light receiving surface has a period of $p1(z1+z2)/z1$, so that forming the second light intensity detecting means having a light receiving width of $mp1(z1+z2)/z1$ on the light receiving surface allows the photosensor to receive the diffraction interference pattern of a period of m. As a result, the photosensor detects the diffraction interference pattern on the light receiving surface at an average intensity level.

Since the average intensity level on the light receiving surface is proportional to the light beam output from the laser light source, the second light intensity detecting means is equivalent to an additional function of monitoring the light beam output from the laser light source.

Even if the ambient environment of the sensor or the status of the returning light changes, therefore, the optical output is stabilized by feeding the output of the second light intensity detecting means to the drive means for the laser light source, thus ensuring stable sensing to such a status change.

To achieve the third subject matter, according to a third aspect (3) of this invention, there is provided an optical displacement sensor comprising:

a light source for emitting coherent light;

a scale displaceable in such a manner as to cross a light beam as the coherent light emitted from the light source and having a diffraction grating of a predetermined period for forming a diffraction interference pattern from the light beam; and a photosensor for receiving a predetermined portion of the diffraction interference pattern, whereby a principal axis of the light beam as the coherent light emitted from the light source is tilted in a predetermined direction to a line perpendicular to that surface of the scale on which the light beam is irradiated.

(Corresponding Embodiment of Invention)

The third aspect (3) of the invention corresponds to a seventh embodiment of this invention.

According to the third aspect (3) of the invention, the scale surface or the light receiving surface of the photosensor is tilted to the principal axis of the light beam emitted from the laser light source to ensure variable sensing by the scale at a higher precision and higher reliability. This arrangement can prevent the light emitted from the laser light source and reflected at the surface of the scale or the photosensor from returning to the laser, thereby suppressing superimposition of noise carried by the returning laser light on the output signal of the sensor.

To achieve the fourth subject matter, according to a fourth aspect (4) of this invention, there is provided an optical encoder comprising:

a coherent light source;

a scale movably supported and formed with a first scale pattern and a second scale pattern for reflecting or diffracting and passing a light beam from the coherent light source;

a beam-splitting optical element, provided between the coherent light source and the scale, for splitting the light beam emitted from the coherent light source into a plurality of beams;

first and second photosensors for detecting the light beams split by the beam-splitting optical element, the first photosensor having a plurality of light receiving areas formed at intervals of approximately $np11(z11+z21)/z11$ in a spatial period direction of a diffraction interference pattern formed on a light receiving surface as a first light beam split by the beam-splitting optical element is optically affected the first scale pattern, where $z11$ is an optical distance along a principal axis of the first light beam from a beam emitting surface of the coherent light source to a surface where the first scale pattern is formed, $z21$ is an optical distance along the principal axis of the first light beam to the first photosensor from the surface where the first scale pattern is formed to the first photosensor, $p11$ is a spatial period of the first scale pattern and n is a natural number, a second light beam among the plurality of light beams split by the beam-splitting optical element being optically affected the second scale pattern and being then received by the second photosensor.

(Corresponding Embodiment of Invention)

The fourth aspect of the invention corresponds to thirteenth to nineteenth embodiments of this invention.

While a vertical resonance type surface emitting laser 10 is described mainly in those embodiments as the "coherent light source", this light source should include an ordinary semiconductor laser 1 and other laser light sources which can emit a coherent light beam.

The term "optical distance" means the distance measured with reference to the wavelength of the light beam.

When the refractive index is constant over the area where the distance is to be measured, for example, the "optical distance" is a geometrically measured distance, whereas when the refractive index varies, the "optical distance" means a change in optical wavelength by the refractive index distribution reflected on the geometric distance along the path to be measured.

The "scale pattern of a predetermined period for forming a diffraction interference pattern" means a diffraction grating having a period modulated pattern of optical characteristics such as the amplitude and phase formed thereon and should cover every diffraction grating including a reflection type diffraction grating for forming a diffraction interference pattern on the light receiving surface and a transmission type diffraction grating.

Also, the "photosensor has a plurality of light receiving areas formed at intervals of approximately $np11(z11+z21)/z11$ in the spatial period direction of the diffraction interference pattern and receives a predetermined portion of the diffraction interference pattern" implies a group of light receiving elements so constructed as to add the outputs of the plural light receiving areas arranged at intervals of $np11(z11+z21)/z11$ in the pitch direction of the diffraction interference pattern on the light receiving surface and output the sum and should include a case where there are plural groups of light receiving elements.

The value of n that determines the distance between the individual light receiving areas should not necessarily be constant over the entire region.

Further, the displacement sensor performs its function even if the distance between the individual light receiving areas is slightly deviated from the numerical condition "np11(z11+z21)/z11" included in the expression "the plural light receiving areas arranged at intervals of np11(z11+z21)/z11 in the pitch direction of the diffraction interference pattern". Even if there is a deviation of about ±30% from the numerical condition "np11(z11+z21)/z11" in working this aspect of the invention, therefore, the optical encoder should be considered to be encompassed within the scope of this aspect of the invention.

The term "optically affected" includes at least one of "reflected", "diffracted" and "transmitted".

(Operation)

The light beam emitted from the coherent light source is split into a plurality of light beams by the beam-splitting optical element, and the first light beam among those light beams is irradiated on the first scale pattern, thus forming a diffraction interference pattern having a predetermined period p11(z11+z21)/z11 on the light receiving surface of the first photosensor.

The following description will be given of a case of n=1 for the sake of simplicity.

It should be noted that, since the light receiving areas of the first photosensor are formed apart from one another in the pitch direction of the diffraction grating at intervals of p21=np2=np11(z11+z21)/z11, each light receiving area detects only a specific portion of the same phase in the diffraction interference pattern on the light receiving surface.

When the scale is displaced by x1 in the pitch direction of the diffraction grating, the scale is displaced by x2=x1(z11+z21)/z11 in the same direction on the light receiving surface in the diffraction interference pattern. Therefore, an output signal which changes with a periodic intensity is acquired from the first photosensor every time the scale is moved by p11 in the pitch direction of the diffraction grating.

The second light beam among those light beams split by the beam-splitting optical element is optically affected the second scale pattern and its intensity is detected by the second photosensor.

Combining the first and second scale patterns as will be discussed later can provide an intensity monitoring function, absolute position detecting function and a reference point (or origin) detecting function for the optical output of the coherent light source.

Two or more of those additional functions may be achieved simultaneously by increasing the number of split beams and the number of the photosensors in accordance with the number of the scale patterns.

As the coherent light source, the scale surface and the light receiving surface can all be arranged in parallel to one another, a mounting mode which does not involve an inclined substrate is possible, which can lead to a significant reduction in assembling cost.

To achieve the fifth subject matter, according to a fifth aspect (5) of this invention, the optical encoder as described in the section (4) is characterized by further comprising:

a first optical beam-bending element provided between the scale and the first photosensor; and a second optical beam-bending element provided between the scale and the second photosensor, whereby the first and second light beams which have been optically affected the first scale pattern and the second scale pattern pass through the first and second optical beam-bending elements to be received by the first and second photosensors, respectively.

(Corresponding Embodiment of Invention)

This aspect of the invention corresponds to sixteenth to eighteenth embodiments of this invention.

According to this structure, the first optical beam-bending element and the second optical beam-bending element may be integrated with the beam-splitting optical element or may be separate therefrom.

(Operation and Effect)

This section does not discuss the same function and effect as those of the fourth aspect (4) of the invention.

After the first and second light beams which have been split by the first beam-splitting optical element are respectively irradiated on the first and second scale patterns and then irradiated on the first and second optical beam-bending elements where the optical axes of the beams are bended again so that the beams are respectively led to the first and second photosensors.

If the angles by which the first beam-splitting optical element and the first and second optical beam-bending elements deflect the optical axes of the associated beams are set equal to one another, the principal axes of the first and second light beams become symmetrical to a line extending perpendicularly from a point where the principal axes cross the scale surface.

As has been mentioned in the section of the prior arts, it is apparent from the equation (2) that even if the spatial gap between the scale 2 and the light source varies, arranging the light source and the photosensor on the same side with respect to the scale 2 and setting z11=z21 and z21=z22 prevent the pitch of the diffraction interference pattern on the light receiving surface from changing.

Therefore, this structure of the invention has an advantage such that the optical distance from the light source to the scale surface, which has been measured along the principal axes of the first and second light beams, to the light receiving element can be made equal to the optical distance from the scale to the light receiving element with a very simple design.

If the height of the light receiving surface and the imaginary position of the light source differ from each other, an optical element for compensating for the difference has only to be inserted in the optical path of the optical axis.

To achieve the sixth subject matter, according to a sixth aspect (6) of this invention, there is provided an optical encoder comprising:

a coherent light source;

a scale movably supported and formed with a first scale pattern and a second scale pattern for reflecting or diffracting and passing a light beam from the coherent light source;

a beam-splitting optical element, provided between the coherent light source and the scale, for splitting the light beam emitted from the coherent light source into a plurality of beams;

first and second photosensors for detecting the light beams split by the beam-splitting optical element, the first photosensor having a plurality of light receiving areas formed at intervals of approximately np11(z11+z21)/z11 in a spatial period direction of a diffraction interference pattern formed on a light receiving surface as a first light beam split by the beam-splitting optical element is optically affected the first scale pattern, where z11 is an optical distance along a principal axis of the first light beam from a beam emitting surface of the coherent light source to a surface where the first scale pattern is formed, z21 is an optical distance along the principal axis of the first light beam to the first photosensor from the surface where the first scale pattern is formed to the first photosensor, p11 is a spatial period of the first scale pattern and n is a natural number, a second light beam among the plurality of light beams split by the beam-splitting optical element being received by the second photosensor without being irradiated on any scale pattern.

(Corresponding Embodiment of Invention)

This aspect of the invention corresponds to a nineteenth embodiment of this invention.

(Operation and Effect)

This section does not discuss the same functions and effects as those of the fourth and fifth aspects (4) and (5) of the invention.

Of the light beams split by the beam-splitting optical element, the second light beam is directly detected by the second photosensor without being irradiated on the scale.

This structure can thus achieve a function for monitoring the optical output of the coherent light source. Even if the ambient environment of the optical encoder which can be adapted as an optical displacement sensor varies, therefore, the optical output can be stabilized by feeding the output of the light intensity detecting means which is comprised of the second photosensor to the drive means for the laser light source. This can ensure stable sensing to such a status change.

As this structure does not require a scale having a uniform reflectance or transmissivity, it leads to a reduction in the cost of the scale and is not affected by a defect or dust or the like in the scale as compared with the embodiments to be discussed later.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A and 2B, which exemplify a surface emitting laser in FIGS. 1A to 1C, are respectively a schematic cross-sectional view of the surface emitting laser and a top view as viewed from a −z direction in FIG. 2A;

FIG. 4 is a schematic cross-sectional view showing another example of the surface emitting laser in FIGS. 1A to 1C;

FIGS. 15A and 15B, which illustrate the schematic structure of an optical displacement sensor according to an eighth embodiment, are respectively a cross-sectional view of an xz plane of the optical displacement sensor according to the eighth embodiment and a cross-sectional view of a yz plane corresponding to FIG. 15A;

FIGS. 17A and 17B, which illustrate the schematic structure of an optical displacement sensor according to a tenth embodiment, are respectively a cross-sectional view of an xz plane of the optical displacement sensor according to the tenth embodiment and a cross-sectional view of a yz plane corresponding to FIG. 17A;

FIGS. 20A and 20B, which illustrate the structure of an optical displacement sensor to be used as an optical encoder according to a thirteenth embodiment of this invention, are respectively a plan view showing the scale 2 in the thirteenth embodiment as viewed towards a −z direction and a cross-sectional view of a yz plane in this embodiment;

FIGS. 23A to 23C, which illustrate the structure of an optical displacement sensor to be used as an optical encoder according to a fifteenth embodiment of this invention, are respectively a plan view showing the scale 2 in the fifteenth embodiment as viewed from a −z direction, a cross-sectional view of an xz plane corresponding to the cross section along a1–a1' in FIG. 23A and a cross-sectional view of an xz plane corresponding to the cross section along a2–a2' in FIG. 23A;

FIG. 28 is a structural diagram showing a laser encoder, as the first prior art, using a coherent light source and a diffraction grating scale as an example of a miniaturized low cost encoder that does not require assembly of optical parts such as a lens;

FIGS. 29A to 29E are operational diagrams for more specifically explaining the displacement sensor using the laser encoder in FIG. 28;

FIGS. 30A and 30B are structural diagrams for explaining a prior art relating to a small displacement sensor using a surface emitting laser light source as the second prior art;

DETAILED DESCRIPTION OF THE INVENTION

Figures 1A, 1B, 1C:
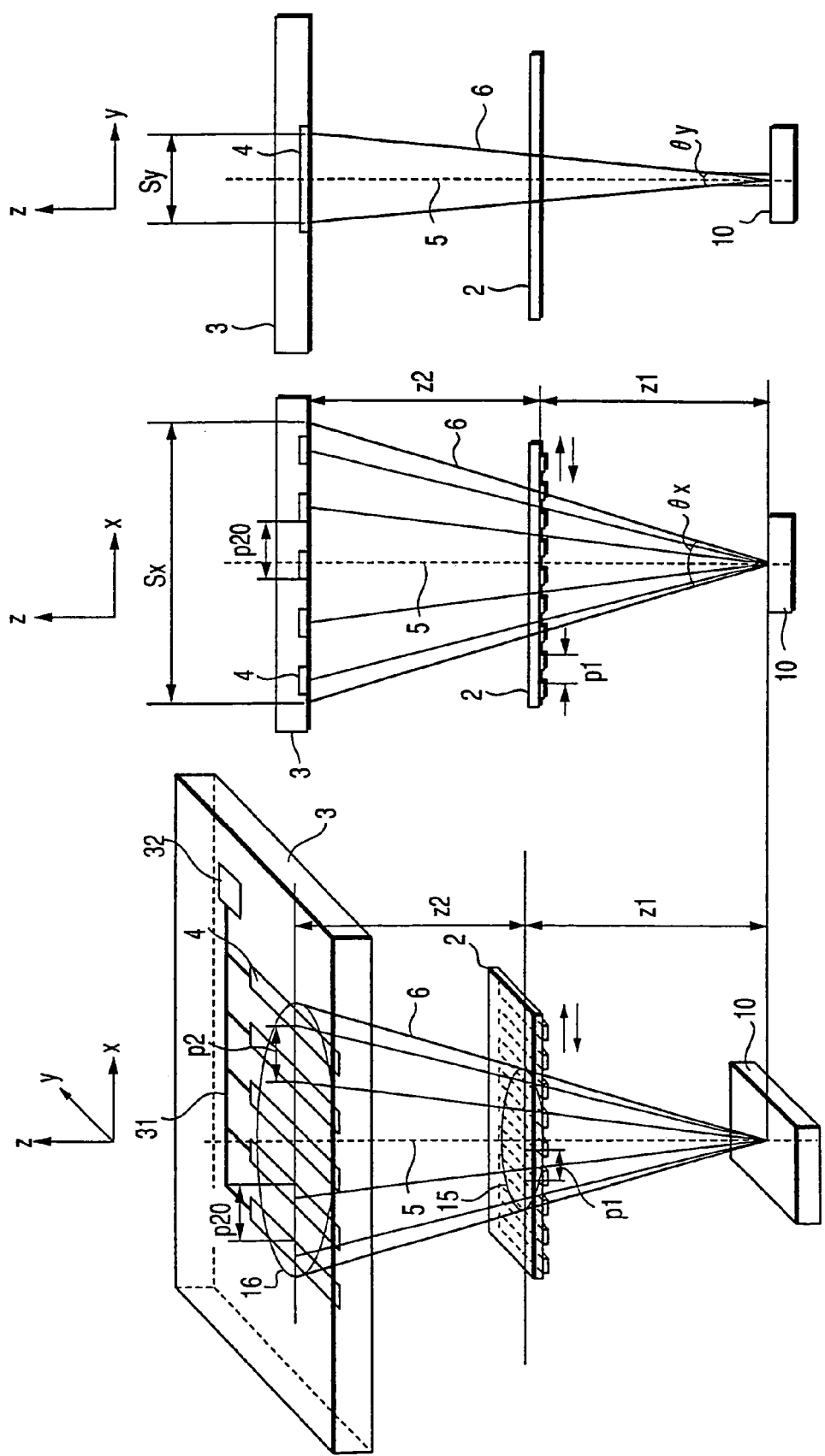
FIGS. 1A to 1C, which illustrate the schematic structure of an optical displacement sensor according to a first embodiment of this invention, are respectively a perspective view showing the first embodiment, a cross-sectional view of an xz plane corresponding to FIG. 1A and a cross-sectional view of a yz plane corresponding to in FIG. 1A.
Figure 3:
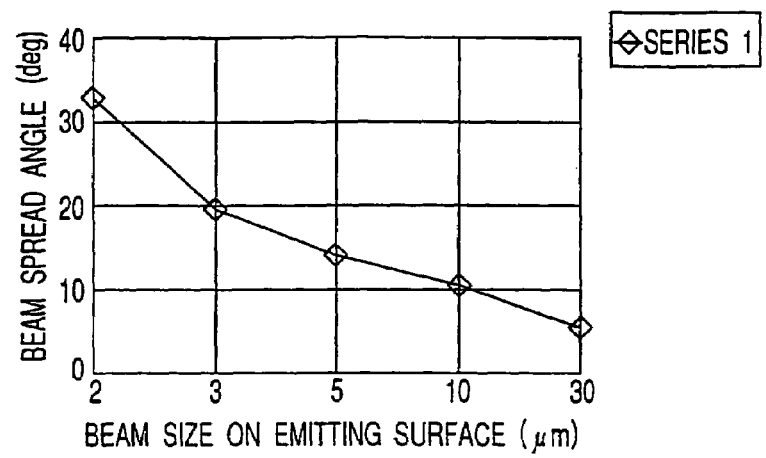
FIG. 3 is a diagram showing the experimental results that have been obtained by evaluating the relationship between the beam size on the light emitting surface of the surface emitting laser and the beam spread angle θ of a prototype prepared.

Reference will now be made in detail to the presently preferred embodiments of the invention as illustrated in the accompanying drawings, in which like reference numerals designate like or corresponding parts.

Preferred embodiments of this invention will be described below with reference to the accompanying drawings.

(First Embodiment)

FIGS. 1A to 1C illustrate the schematic structure of an optical displacement sensor according to a first embodiment of this invention. FIG. 1A is a perspective view showing the structure of the first embodiment, FIG. 1B is a cross-sectional view of an xz plane corresponding to FIG. 1A and FIG. 1C is a cross-sectional view of a yz plane corresponding to in FIG. 1A.

As shown in FIGS. 1A to 1C, a surface emitting laser light source 10 and a scale 2 are arranged with such a positional relationship that the light beam emitted from this light source 10 is irradiated on the scale 2, and a photosensor 3 is located so as to receive a predetermined portion of a diffraction interference pattern formed from the light source by the scale 2.

An area 4 in FIGS. 1A to 1C indicates a light receiving area where the photosensor 3 is so located as to receive a predetermined portion of the diffraction interference pattern. If a plurality of light receiving areas 4 are provided, the light receiving areas 4 are mutually connected by electric wirings 31 so that the sensor output can be acquired from an output pad 32.

A dotted line 5 in FIGS. 1A to 1C indicates the principal axis of the light beam emitted from the surface emitting laser light source 10, and solid lines 6 indicate boundary lines for the spreading of the light beam. An area 15 in FIGS. 1A to 1C show the light-beam spreading area on the surface where the diffraction grating of the scale 2 is formed and an area

16 in FIGS. 1A to 1C shows the light-beam spreading area on the light receiving area of the photosensor 3.

To secure the clearness of the diffraction interference pattern on the light receiving surface, as mentioned earlier, it is desirable that the distances among the surface emitting laser light source 10, the scale 2 and the photosensor 3 should satisfy the relationship given by the equation (1).

The operation of the first embodiment of this invention will now be described.

The light beam emitted from the surface emitting laser light source 10 which has a predetermined beam shape is irradiated on the scale 2 where the diffraction grating is formed.

The scale 2 is so displaced as to cross the light beam from the surface emitting laser 10.

The light that has been diffracted by the scale 2 generates a diffraction interference pattern on the light receiving surface of the photosensor 3. A single or plural of light receiving area 4 formed on the photosensor 3 detects a predetermined portion of the diffraction interference pattern.

As the sensor signal periodically changes in accordance with the displacement of the scale 2 across the light beam, the amount of displacement of the scale 2 can be detected.

To acquire a signal with a higher S/N ratio by increasing the output signal of the sensor, the light receiving area 4 on the photosensor 3 is formed by integrating a plurality of areas in such a way as to have a given spatial period p20 in the same direction as the pitch direction of the diffraction grating of the scale 2, as shown in FIGS. 1A to 1C.

Because it is desirable for the spatial period p20 of the light receiving areas to be equal to the period p2 of the diffraction interference pattern on the light receiving surface, p20 is set approximately equal to $np1(z1+z2)/z1$.

According to the first embodiment, the surface emitting laser light source 10 is used as the light source instead of the conventional semiconductor laser 1 in FIG. 28. Even if the area 16 where the light receiving area is formed is restricted to an area close to the principal axis of the light beam from the light source 10, therefore, it is possible to set the beam spread angle corresponding to the spreading of the area 16 for the formation of the light receiving area. This allows the diffraction interference pattern to be produced in the area 16 for the formation of the light receiving area by effectively using the amount of light from the light source 10.

By not spreading the area where the diffraction interference pattern is to be formed more than needed, the pitch deviation between the diffraction interference pattern on the light receiving area and the distributed light receiving area 16 can be reduced even when the arrangement of the surface emitting laser light source 10, the scale 2 and the photosensor 3 is shifted from the optimal one. Accordingly, this optical displacement sensor is capable of providing an output signal which has an excellent signal amplitude and excellent S/N ratio.

The spread angle of the light beam from the surface emitting laser light source 10 can be designed freely with respect to the scale pitch direction (x direction) and a direction perpendicular to the scale pitch (y direction), for example, the light-beam spreading width over a plurality of pitches can be set on the surface of the scale 2 in the pitch direction of the scale 2, and a narrower light-beam spreading width can be set in the direction perpendicular to the former direction. It is therefore possible to minimize the sizes of the scale 2 and the photosensor 3, which leads to miniaturization of the sensor and cost reduction.

The individual components of the first embodiment of this invention can of course be changed or modified in various forms.

Although a vertical resonance type surface emitting laser has been discussed mainly in this embodiment as the surface emitting laser light source 10, for example, the surface emitting laser should include a surface emitting laser formed by integrating an edge emitting type semiconductor laser and an optical waveguide, a rising mirror or a diffraction grating should be covered.

The "diffraction grating of a predetermined period for forming a diffraction interference pattern" in this structure means a diffraction grating having a period modulated pattern of optical characteristics such as the amplitude and phase formed thereon and should cover every diffraction grating including a reflection type diffraction grating for forming a diffraction interference pattern on the light receiving surface and a transmission type diffraction grating.

Figure 31A:
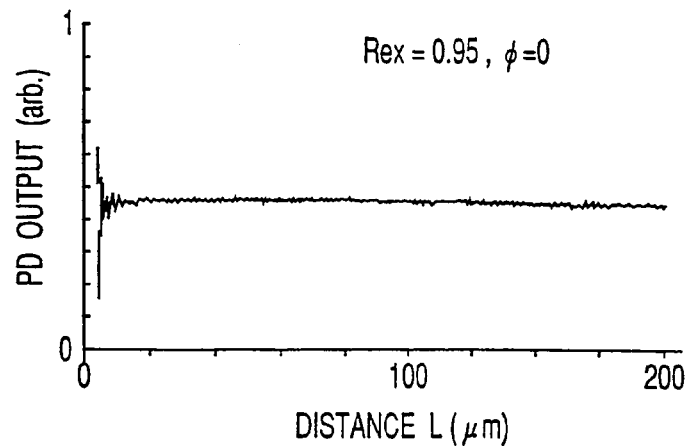
FIGS. 31A to 31C are diagrams showing a case where an edge emitting type semiconductor laser which is an ordinary conventional semiconductor laser widely used is used as the light source (FIG. 31A), in comparison with a case where a surface emitting laser is used (FIG. 31B) and the characteristics when an outer mirror is tilted by 0.5° (FIG. 31C) as typical examples of calculation for explaining that the output characteristics of the sensor when the distance L is changed depend on many structural parameters.
Figure 31B:
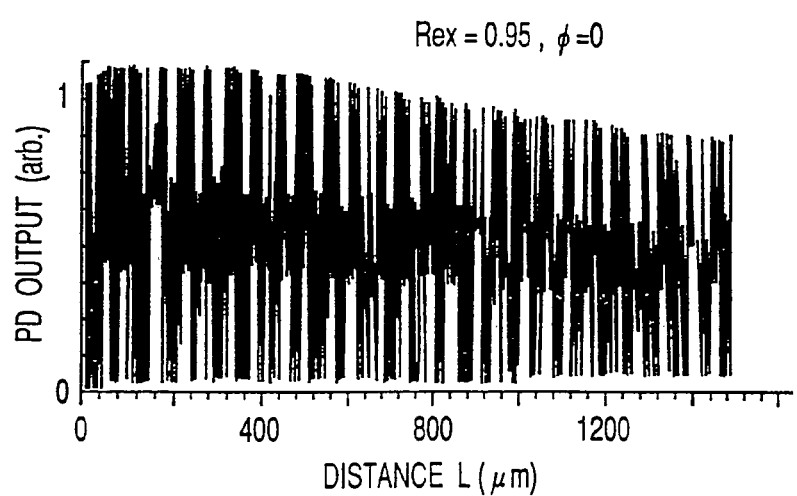
Figure 31C:
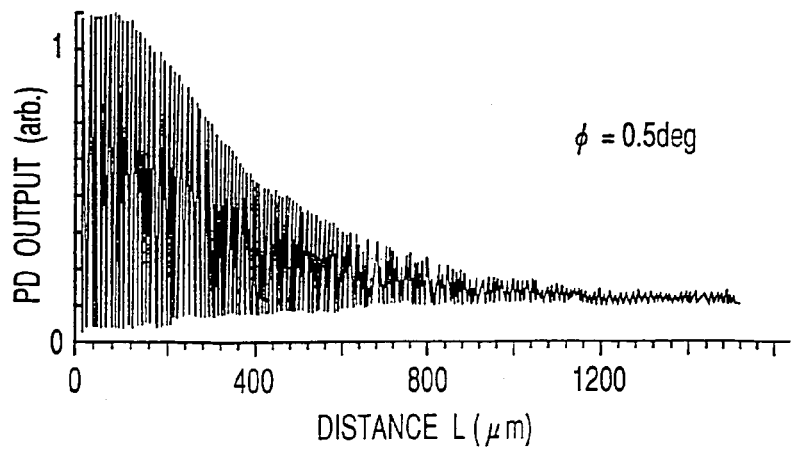

As the light source is the surface emitting laser light source 10, when the surface of the photosensor 3 and the principal axis of the light beam are set perpendicular to each other, noise on the returning light from the scale 2 or the light receiving surface is large as shown in FIGS. 31A to 31C.

To reduce this noise, it is desirable to perform an optical treatment on the scale 2 and the light receiving surface of the photosensor 3 to suppress reflection.

Figures 5A, 5B:
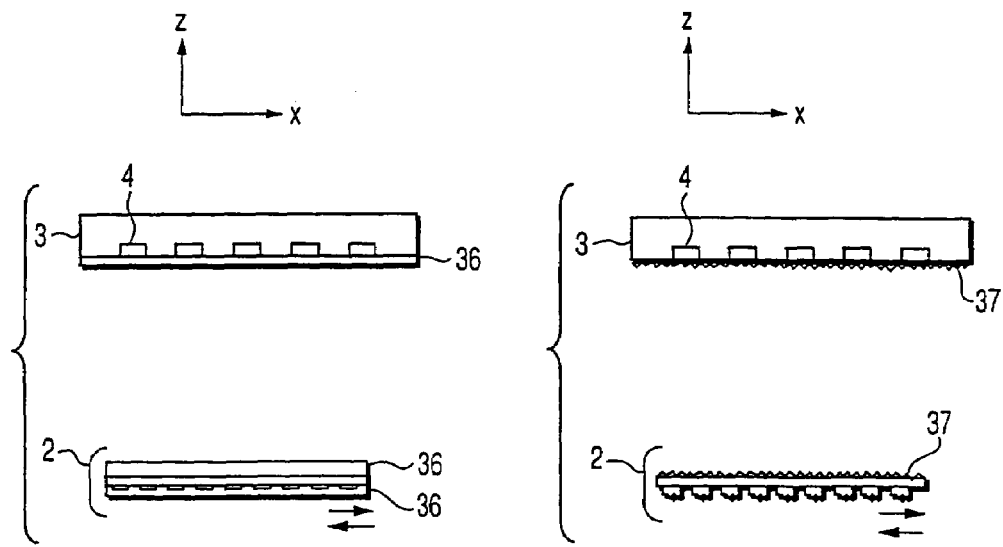
FIGS. 5A and 5B are diagrams showing an example where a reflection preventing film 36(a) for suppressing reflection and a treating section 37(b) which provides a light scattering effect are formed on a scale 2 and the light receiving surface of a photosensor 3 by respective optical processes in order to reduce noise in the returning light from the scale and the light receiving surface in FIGS. 1A to 1C.

For example, it is desirable to form a reflection preventing film 36 on the scale 2 and the light receiving surface of the photosensor 3 as shown in FIG. 5A, or to form a treating section 37 which has fine upheavals on its surface to provide a light scattering effect as shown in FIG. 5B.

It is to be noted that this optical treatment to suppress reflection can likewise be applied to the other embodiments of this invention, though this description will not be repeated to avoid the redundant description.

(Second Embodiment)

An optical displacement sensor according to a second embodiment of this invention will now be described with reference to FIGS. 6A and 6B.

Figure 6A:
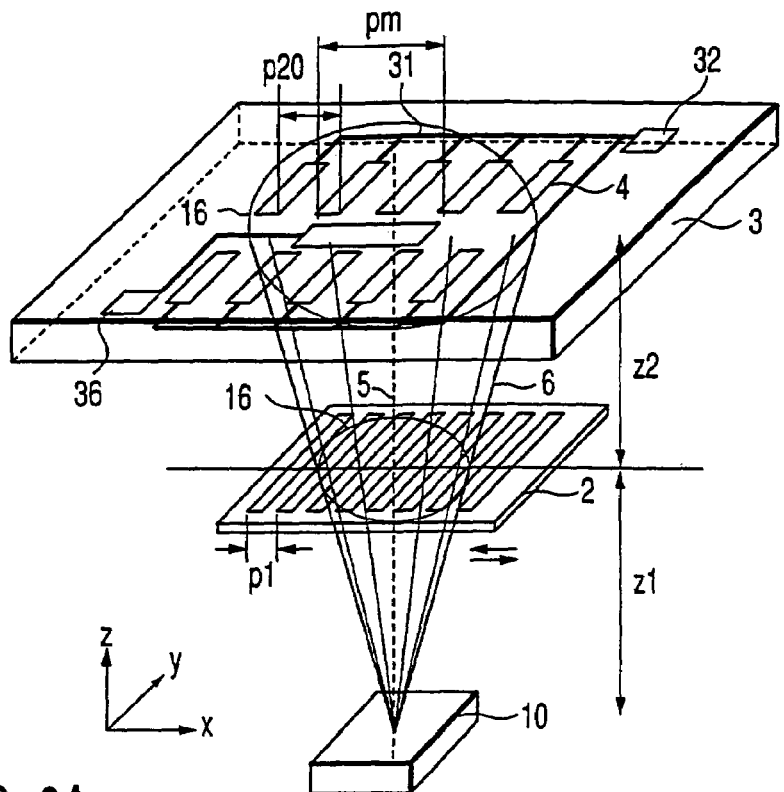
FIG. 6A is a perspective view showing an optical displacement sensor according to a second embodiment.
Figure 6B:
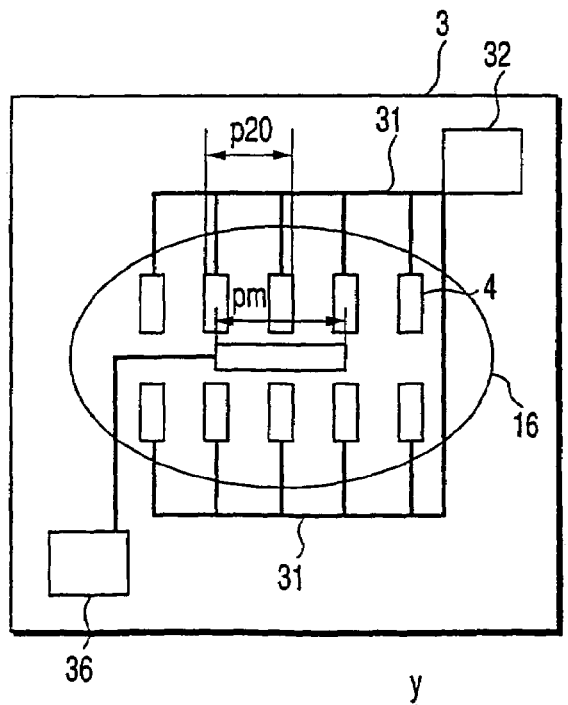
FIG. 6B is a plan view showing the light receiving surface of a photosensor 3 in FIG. 6A as viewed towards the −z direction.

FIG. 6A is a perspective view showing the optical displacement sensor according to the second embodiment, and FIG. 6B is a plan view showing the light receiving surface of the photosensor 3 in FIG. 6A as viewed towards the −z direction.

For those portions which are common to those of the first embodiment, their description will partly be omitted below.

In addition to the light intensity detecting means that is comprised of a plurality of light receiving areas formed at intervals of $p2=np1(z1+z2)/z1$, the aforementioned second light intensity detecting means is formed with a light receiving width of $pm=mp1(z1+z2)/z1$ (where m is a natural number different from n) in the pitch direction of the diffraction interference pattern on the light receiving surface, and those light intensity detecting means are connected to an output acquisition pad 32 and a pad 36 via the wirings 31 in the diagrams.

Figures 16A, 16B:
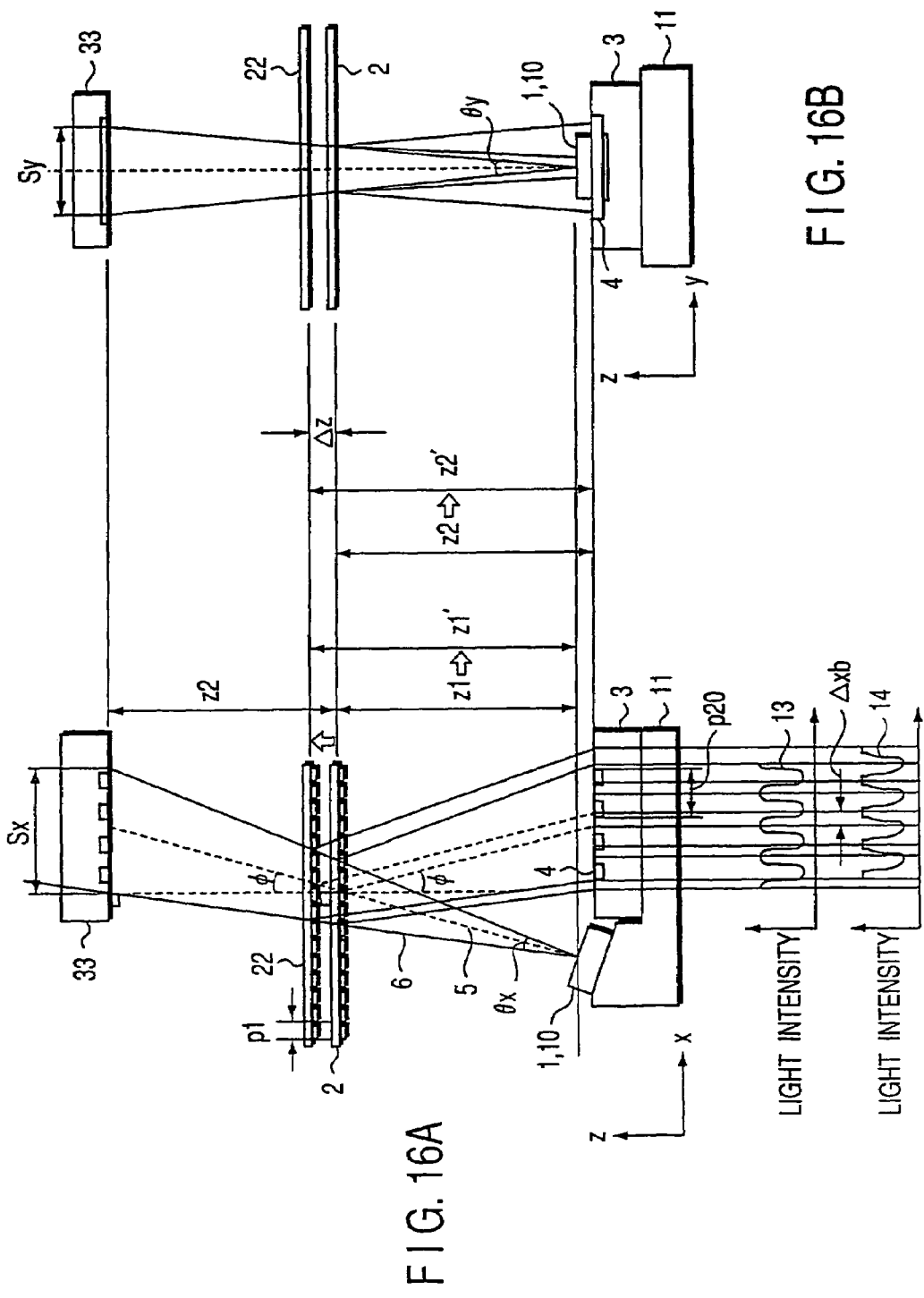
FIGS. 16A and 16B, which illustrate the schematic structure of an optical displacement sensor according to a ninth embodiment, are respectively a cross-sectional view of an xz plane of the optical displacement sensor according to the ninth embodiment and a cross-sectional view of a yz plane corresponding to FIG. 16A.

The area 16 in FIGS. 16A and 16B indicates the light-beam spreading area on the light receiving surface. It is desirable that the aforementioned plurality of light receiving areas or the light receiving area of the second light intensity detecting means should be formed in this area 16.

The operation of the second embodiment of this invention will now be described.

An electric signal is periodically output from the pad 32 every time the scale 2 is displaced by P1 in the pitch direction. An electric signal which is proportional to the laser output from the light source 10 is output from the pad 36.

The electric signal output from the pad 36 serves to monitor the laser output from the light source 10. As this electric signal is fed back to the means (not shown) for driving the light source 10, a variation in the laser output can be suppressed, for example, when the ambient temperature or pressure changes or the returning light changes the laser output.

This can ensure stable displacement sensing even if the environment around the sensor changes.

Note that the integration of the second light intensity detecting means in the photosensor can also be applied to the other embodiments of this invention.

(Third Embodiment)

An optical displacement sensor according to a third embodiment of this invention will now be described with reference to FIG. 7.

Figure 7:
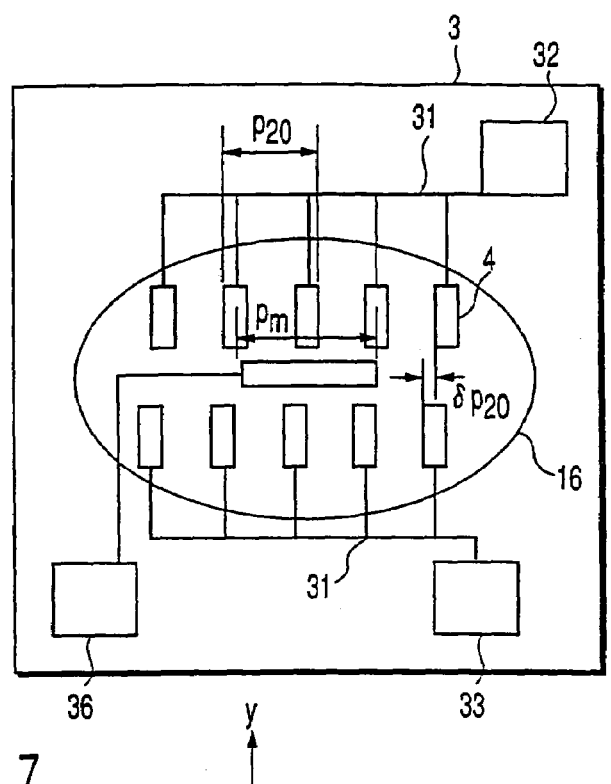
FIG. 7 is a plan view illustrating an optical displacement sensor according to a third embodiment and, like FIG. 6B, showing the light receiving surface of the photosensor 3 in FIG. 6A as viewed from the scale side.
Figure 8:
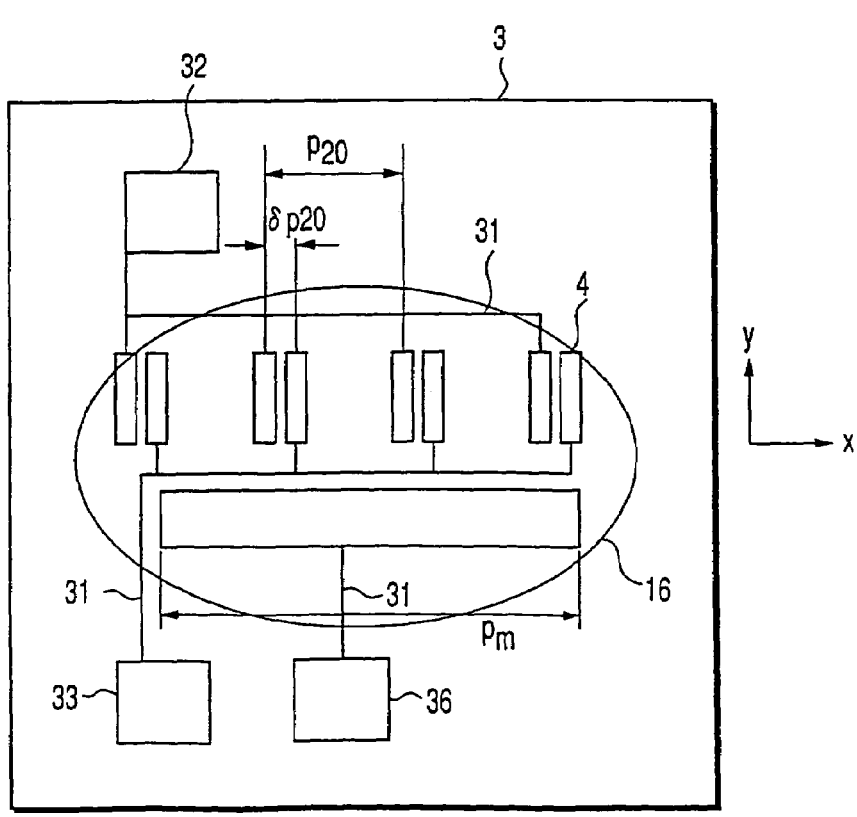
FIG. 8 is a diagram exemplifying a structure in which two separate groups of light receiving areas in FIG. 7 are alternately formed by an odd multiple of p2/4.

FIG. 7 is a plan view of the light receiving surface of the photosensor 3 in FIG. 6A as viewed towards the −z direction.

For those portions which are common to those of the second embodiment, their description will be partly omitted below.

There are two sets of light intensity detecting means which are each comprised of a plurality of light receiving areas formed at intervals of p2=np1(z1+z2)/z1 and are connected to output pads 32 and 33 via the wirings 31.

The two groups of light receiving areas are shifted from each other by δp20 in the x direction on the light receiving surface.

The operation of the third embodiment of this invention will now be described.

When the scale 2 is displaced in the pitch direction, electric signals of different phases are output from the output pads 32 and 33.

Using the phase relationship between the electric signals output from the output pads 32 and 33, it is possible to detect the direction of the movement of the scale 2 or a minute amount of displacement equal to or less than the pitch p1 caused by the phase segmentation of the signals.

Referring to FIG. 7, if the spatial layout deviation δp20 of plural groups of light receiving areas is set to an odd multiple of p2/4 in the pitch direction of the scale 2, the phase difference of the signals from each group of light receiving areas is shifted by a ¼ period or ¾ period, thus yielding so-called encoder signals of phase A and phase B.

The two groups of light receiving areas in FIG. 7 may be formed in such a fashion that different groups of light receiving areas are alternately formed and deviated by an odd multiple of p2/4 from each other.

In this case, even if the light beam is shifted in the y direction from the optimal state, the ratio of the average output level from one group of light receiving areas to that of the other group hardly changes, thus ensuring stable sensing.

(Fourth Embodiment)

An optical displacement sensor according to a fourth embodiment of this invention will now be described with reference to FIG. 9.

Figure 9:
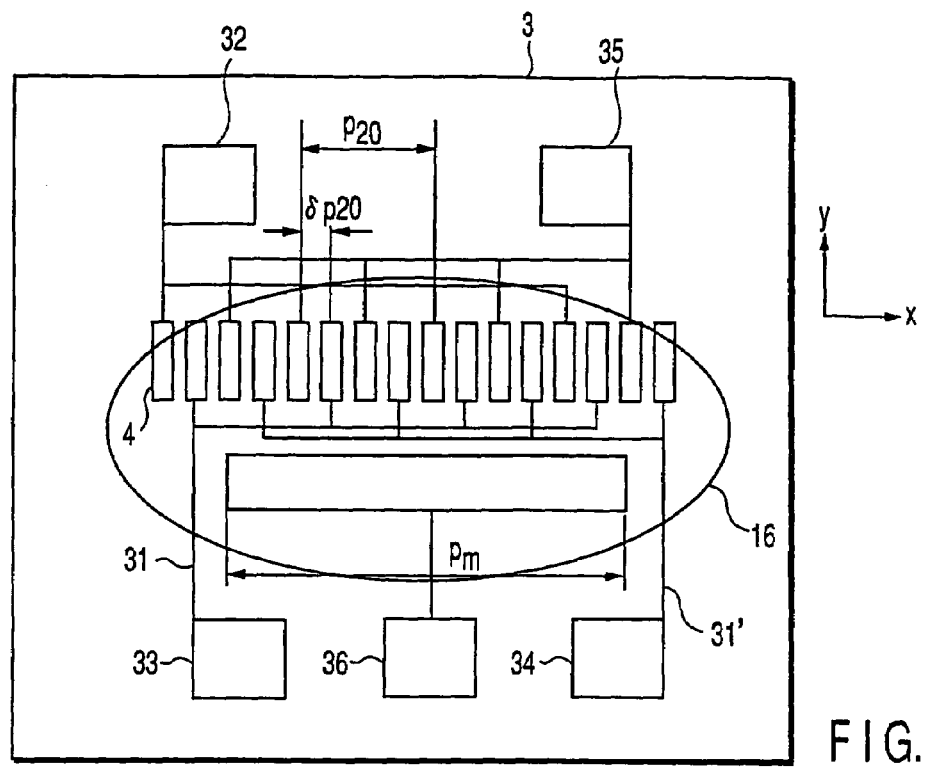
FIG. 9 is a plan view illustrating an optical displacement sensor according to a fourth embodiment and, like FIG. 6B, showing the light receiving surface of the photosensor 3 in FIG. 6A as viewed towards the −z direction.

FIG. 9 is a plan view of the light receiving surface of the photosensor 3 in FIG. 6A as viewed from the scale side.

With regard to those portions which are common to those of the second and third embodiments, their description will be partly omitted below.

According to the fourth embodiment, four groups of light receiving areas are alternately formed from one another by δp20.

Although wirings 31 and 31' in FIG. 9 are so drawn as to cross each other, they are formed into a multi-layer structure by respective interconnection layers or the like and are thus electrically isolated from each other.

Referring to FIG. 9, "32", "33", "34" and "35" denote pads for acquiring electric signals from the individual groups of light receiving areas.

The spatial layout deviation δp20 of plural groups of light receiving areas is normally set to an odd multiple of p2/4.

The operation of the fourth embodiment of this invention will now be discussed.

The pads 32, 33, 34 and 35 output four signal signals, respectively, each having a phase difference of a quarter (¼) cycle with respect to the immediate preceding signal. More precisely, these signals are the A phase, B phase, $\underline{A}$ phase and $\underline{B}$ phase of a so-called "encoder signal."

The A-phase signal and the $\underline{A}$-phase signal have the opposite phases, and the B-phase signal and the $\underline{B}$-phase signal have the opposite phases. Hence, if a signal representing the phase difference between the A-phase and $\underline{A}$-phase signals and a signal representing the phase difference between the B-phase and the $\underline{B}$-phase signals are used, it is possible perform stable signal detection, not influenced by stray light coming from the environment.

In this invention, the intensity of the laser beam can be monitored by calculating the sum of the outputs A phase, B phase, $\underline{A}$-phase, $\underline{B}$-phase, making it possible to correct to some extent the influence of a change in environment and a time-dependent change on the change in intensity of the laser beam by feeding back the sum to make constant the change in intensity of the laser beam caused by the change in environment and by time-dependent change, or by performing an adequate arithmetic operation on the output signal of the phase A (or phase B) and the signal of the sum of the individual outputs the A, B, $\underline{A}$ and $\underline{B}$ phases.

(Fifth Embodiment)

An optical displacement sensor according to a fifth embodiment of this invention will now be described with reference to FIG. 10.

The description of those portions which are common to those of the first embodiment will be partly omitted below.

The surface emitting laser light source 10 emits two light beams from different positions, which are both irradiated on the scale 2.

Figure 10:
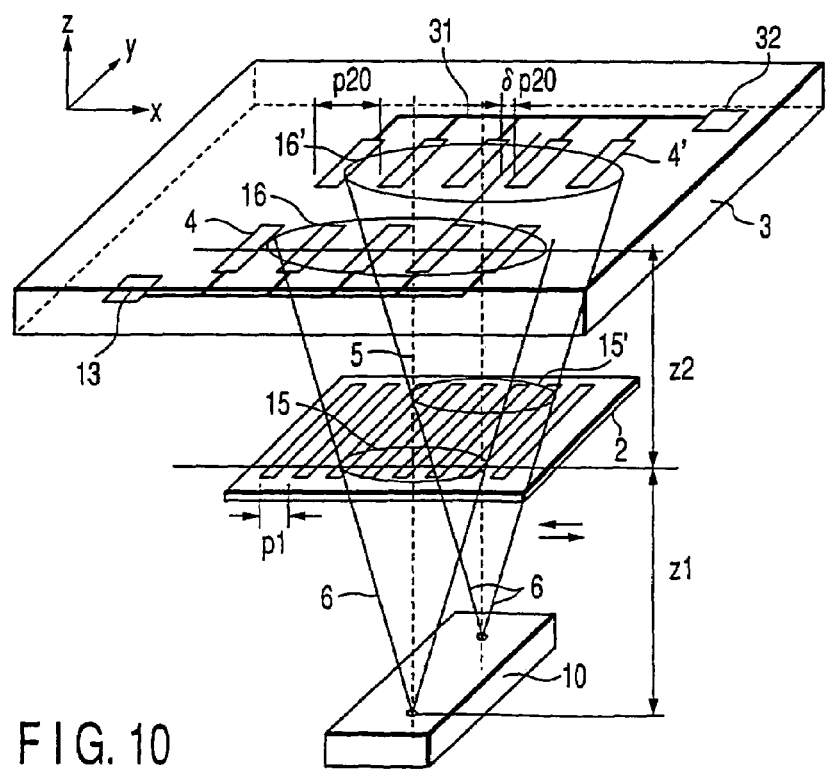
FIG. 10 is a perspective view showing an optical displacement sensor according to a fifth embodiment.

Areas 15 and 15' in FIG. 10 indicate the light-beam spreading areas on the scale 2, and diffraction interference patterns are so formed as to lie over those areas.

The diffraction interference patterns corresponding to the areas 15 and 15' are chiefly formed in portions 16 and 16' in the diagram, and groups of light receiving area are formed so as to detect a predetermined spatial phase portion of each diffraction interference pattern.

It is desirable that the amount of deviation δp20 of those groups of light receiving areas in the pitch direction should be set to an odd multiple of p2/4.

The operation of the fifth embodiment of this invention will now be discussed.

With the structure as shown in FIG. 10, the output pads 32 and 33 provide so-called phase-A and phase-B outputs.

This embodiment can be modified in various forms.

For example, the second light intensity detecting means may be integrated to monitor the light beam or four groups of light receiving areas may be provided, yielding four-phase outputs of phase A, phase B, phase A and phase B, as illustrated in the foregoing sections of the second to fourth embodiments.

(Sixth Embodiment)

Figure 11:
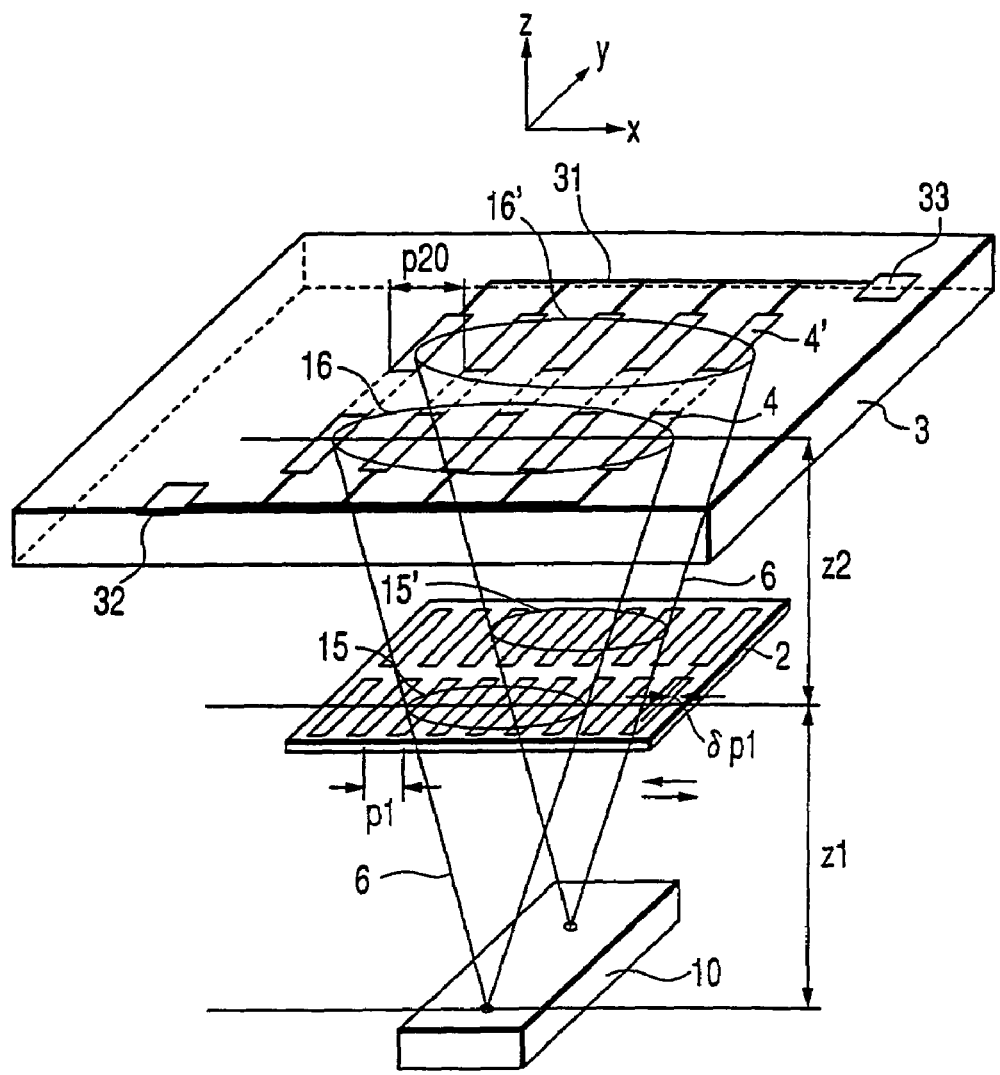
FIG. 11 is a perspective view showing an optical displacement sensor according to a sixth embodiment.

An optical displacement sensor according to a sixth embodiment of this invention will now be discussed with reference to FIG. 11.

The description of those portions which are common to those of the first embodiment will be partly omitted below.

Two groups of diffraction grating patterns are formed on the scale 2 and are arranged in such a way that the light beams emitted from the surface emitting laser light source 10 are respectively irradiated on both diffraction grating patterns.

The two groups of diffraction gratings generate diffraction interference patterns on different areas on the light receiving surface of the photosensor 3 and two groups of light receiving areas formed on the photosensor 3 are so formed as to selectively receive only specific phase portions of those diffraction interference patterns.

It is desirable that the positional deviation of the two groups of diffraction gratings on the scale 2 in the pitch direction should be set to an odd multiple of p2/4.

The operation of the sixth embodiment of this invention will now be discussed.

By setting the positional deviation between the two groups of diffraction gratings on the scale 2 in the pitch direction to an odd multiple of p1/4, diffraction interference patterns of spatial phases different from each other by p2/4 in the pitch direction are formed on the light receiving surface of the photosensor 3 (p2: the pitch of the diffraction interference patterns on the light receiving surface).

Even when the two groups of light receiving areas formed on the photosensor 3 are set without a positional deviation in the pitch direction, therefore, signals having a phase difference of an odd multiple of the ¼ period are acquired from the pads 32 and 33.

It is thus possible to detect the direction of the movement of the scale 2 or a minute amount of displacement equal to or less than the pitch p1 caused by the phase segmentation of the signals, as per the second embodiment.

With this structure, as the distance between the emission positions of the two light beams from the surface emitting laser light source 10 becomes larger, the diffraction interference patterns corresponding to those positions can be formed spatially apart from each other. This can suppress such a problem that the diffraction interference pattern in the beam spreading area 15 on the scale 2 is slightly detected by the group of light receiving areas 4' which should receive the other diffraction interference pattern, thus reducing the interference of the signals to be output from the pads 32 and 33.

This embodiment can be modified in various forms.

For example, the second light intensity detecting means may be integrated to monitor the light beam or four groups of light receiving areas may be provided, yielding four-phase outputs of phase A, phase B, phase A and phase B, as illustrated in the foregoing sections of the second to fourth embodiments.

(Seventh Embodiment)

An optical displacement sensor according to a seventh embodiment of this invention will now be discussed with reference to FIGS. 12A and 12B.

The description of those portions which are common to those of the first to fifth embodiments will be partly omitted below.

With a structure similar to that of the first embodiment, the principal axis of the light beam emitted from the surface emitting laser light source 10 is tilted by a predetermined angle $\phi$ to a line perpendicular to the surface of the scale 2.

It is desirable as will be discussed later that the surface of the scale 2 should be set in parallel to the light receiving surface of the photosensor 3.

The operation of the seventh embodiment of this invention will now be discussed.

Tilting the principal axis of the light beam by the predetermined angle $\phi$ to the scale 2 reduces the light returning to the surface emitting laser light source 10 from the scale 2 so that even when the optical distance between the scale 2 and the light source 10 is changed slightly, the output of the light source 10 can be kept stable.

As one example, FIG. 31B shows the results of computation of a variation in the output of the light source for $\phi=0$ in a case where the light source is a surface emitting laser and the distance between the scale 2 or the mirror that is regarded as the light receiving surface and the beam emitting surface of the surface emitting laser or LD is changed, and FIG. 31C shows the results of such computation for $\phi=0.5°$. (The results of the computation are recited in the aforementioned paper.)

The computation results show that even slight tilting of $0.5°$ demonstrate a good effect of reducing a variation in the output of the light source and further tilting can suppress a variation in the output of the light source caused by the returning light even if there is a small distance between the light source and the mirror (equivalent to the scale in this invention).

When the light source is a surface emitting laser as mentioned above, particularly, this structure demonstrates a superb effect of reducing noise generated by the returning light.

When the scale surface is arranged in parallel to the light receiving surface, provided that L1 and L2 are the mutual distances of the light source, the scale surface and the light receiving surface on the lines that connect the light source to the scale surface and the light receiving surface and z1 and z2 are the mutual distances between the light source and the scale surface and the light receiving surface on lines perpendicular to the scale, then z1/z2=L1/L2 every where on the light receiving surface as expected from the equation (2), so it is predicted that the pitch of the diffraction interference pattern on the light receiving surface becomes constant.

When the tilt angle is small, the equation (1) appears to be approximately met in the beam spreading area Sx by making z1 and z2 satisfy the equation (2). It is therefore expected that the clearness of the diffraction interference pattern is hardly changed at almost everywhere in the area Sx from that of the case of $\phi=0$.

Figure 13A:
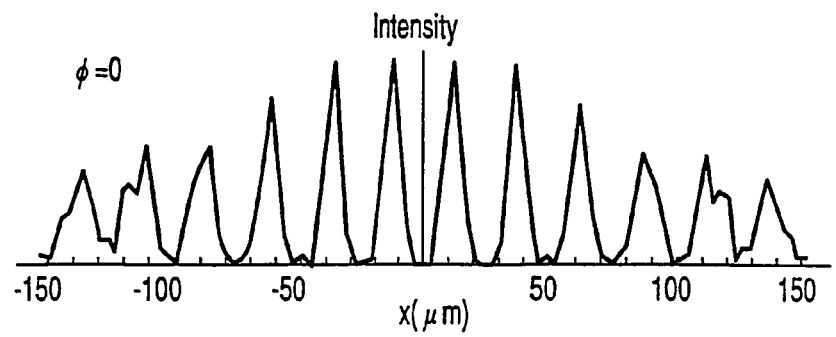
FIGS. 13A and 13B are diagrams showing the results of computing a diffraction interference pattern on the light receiving surface with a tilt angle φ=0 under a predetermined condition in comparison with the computation results in a case where the tilt angle φ=10°.
Figure 13B:
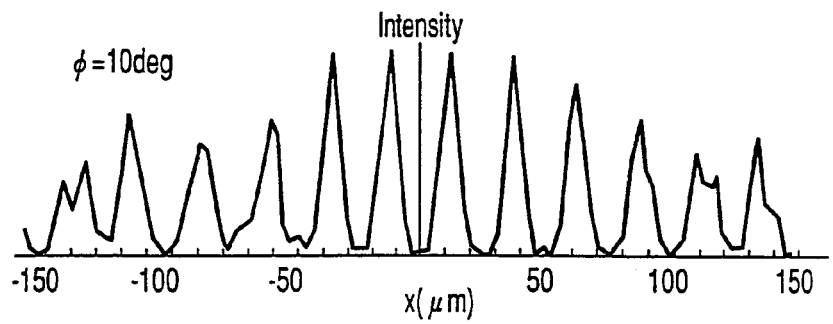

To check those points, the results of computing a diffraction interference pattern on the light receiving surface with a tilt angle $\phi=0$ under the following conditions and the computation results in a case where the tilt angle $\phi=10°$ are respectively illustrated in FIGS. 13A and 13B in comparison with each other.

(Computation Conditions)

optical wavelength $\lambda=1$ µm distance between the light source and scale z1=500 µm distance between the light receiving surface and scale z2=500 pm beam spread angle $\theta x=7°$ (on the assumption that the intensity distribution in the x direction is rectangular)

the scale surface is arranged in parallel to the light receiving surface

It is apparent from FIGS. 13A and 13B that even if the scale is tilted, arranging the scale surface in parallel to the light receiving surface does not change the pitch of the diffraction interference pattern in the x direction, and that the tilt angle of about 10° results in just slight reductions in the periodicity and clearness of the diffraction interference pattern on the light receiving surface.

Even if the scale surface is tilted to the principal axis of the laser beam, that is, the scale surface and the light receiving surface are in parallel each other, with p1, z1 and z2 being fixed values, the spatial period of the diffraction interference pattern in the x direction becomes constant so that the pitch of the light receiving areas has only to be constant with respect to the x direction. This facilitates the design of the light receiving areas.

Because of the same reason, there is another advantage such that even slight deviation of arrangement of the photosensor in the pitch direction of the scale does not raise a problem of a deviation in pitch between the diffraction interference pattern and the light receiving areas.

Figures 12A, 12B:
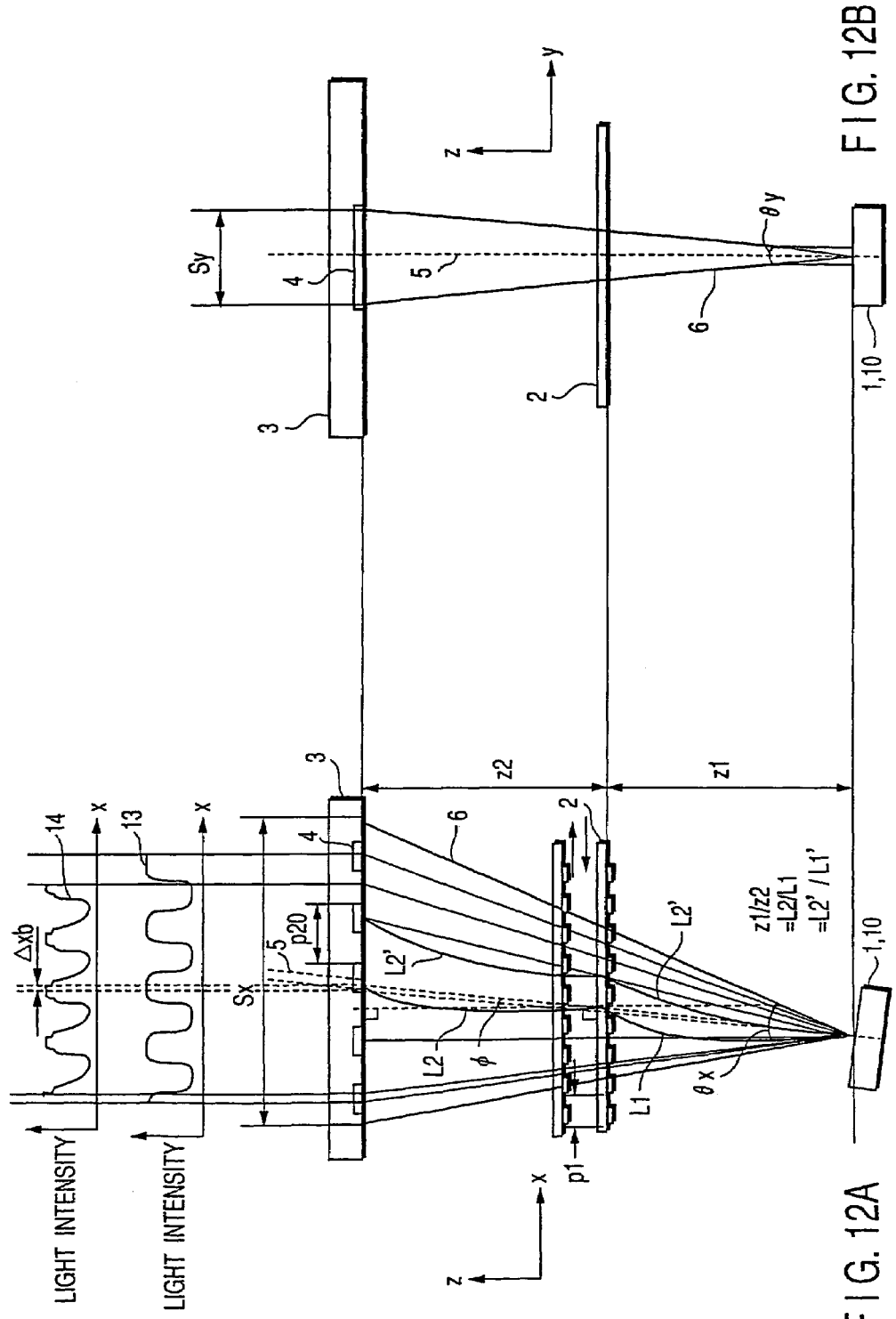
FIGS. 12A and 12B, which illustrate the schematic structure of an optical displacement sensor according to a seventh embodiment, are respectively a cross-sectional view of an xz plane of the optical displacement sensor according to the seventh embodiment and a cross-sectional view of a yz plane corresponding to FIG. 12A.

It is to be noted that when the distance z1 between the scale and the light source is changed by Δz, the phase (or the peak position) of the optical displacement sensor diffraction interference pattern on the light receiving surface is shifted in the x direction in the positional relationship illustrated in FIGS. 12A and 12B.

This embodiment can be modified in various forms.

The structures and arrangement of the light source, the scale and the photosensor in this embodiment can be modified as those of the second to sixth embodiments, thereby additionally providing the above-described effects associated with those embodiments.

Figure 14:
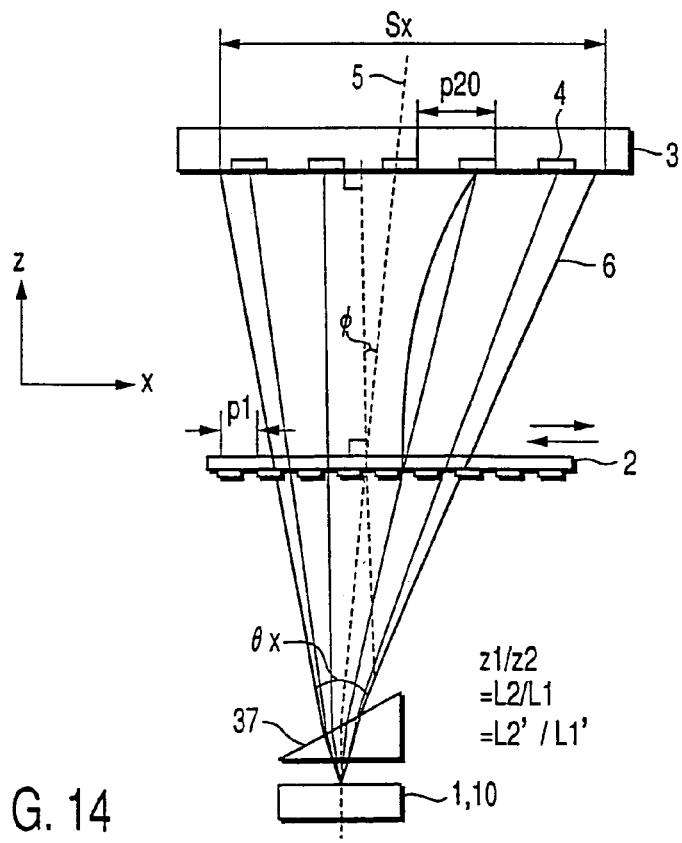
FIG. 14 is a diagram depicting a case of using an optical part (e.g., a prism) which deflects the optical axis as a modification of a scheme of tilting the light beam emitted from a light source to the scale surface.

The scheme of tilting the light beam emitted from the surface emitting laser light source with respect to the scale surface may be implemented by using optical parts (e.g., a prism) which deflects the optical axis as shown in FIG. 14 as well as tilting the direction of the light source as shown in FIGS. 12A and 12B.

(Eighth Embodiment)

An optical displacement sensor according to an eighth embodiment of this invention will now be discussed with reference to FIGS. 15A and 15B.

The description of those portions which are common to those of the seventh embodiment will be partly omitted below.

Although the seventh embodiment has not defined the structure where the principal axis of the light beam from the light source is set perpendicular to a specific direction of the scale surface, the pitch direction of the diffraction grating formed on the scale is arranged perpendicular to the principal axis of the light beam which is emitted from the light source 1, 10 that emits the coherent light and the surface where the diffraction grating of the scale 2 is formed is arranged in parallel to the light receiving surface of the photosensor according to the eighth embodiment.

According to the eighth embodiment, therefore, a direction perpendicular to the pitch direction of the diffraction grating formed on the scale 2 and the principal axis of the light beam emitted from the light source that emits coherent light are tilted by an angle φ.

The operation of the eighth embodiment of this invention will now be discussed.

According to this embodiment, as the principal axis of the light beam is set perpendicular to the pitch direction of the diffraction grating, even if the distance between the scale 2 and the light source 1, 10 changes by Δz, the diffraction interference pattern to be produced on the light receiving surface becomes symmetrical to the principal axis of the light beam so that a deviation of the peak position of the diffraction interference pattern on the light receiving surface becomes small in the vicinity of the principal axis of the light beam.

The movement of the diffraction interference pattern in the x direction caused by a variation of Δz which may raise a problem in the sixth embodiment is suppressed in the vicinity of the principal axis of the light beam, thus ensuring precise sensing of the displacement of the scale 2 in the x direction.

The use of the surface emitting laser which has a beam spread width corresponding to the distribution of the light receiving areas in the vicinity of the principal axis of the light beam can permit the effective use of the intensity of the laser light, thereby ensuring sensing with a high S/N ratio.

This embodiment can be modified in various forms.

The structures and arrangement of the light source, the scale and the photosensor in this embodiment can be modified as those of the second to sixth embodiments, thereby additionally providing the above-described effects associated with those embodiments.

The scheme of tilting the light beam emitted from the surface emitting laser light source with respect to the scale surface may be implemented by using optical parts (e.g., a prism) which deflects the optical axis as shown in FIG. 14 as well as tilting the direction of the light source as shown in FIG. 15.

(Ninth Embodiment)

An optical displacement sensor according to a ninth embodiment of this invention will now be discussed with reference to FIGS. 16A and 16B.

The description of those portions which are common to those of the sixth embodiment will be partly omitted below.

The light beam emitted from the light source 1, 10 is diffracted on the scale 2, and is returned to the same side as the light source 1, 10 with respect to the scale 2, thereby generating a diffraction interference pattern on the light receiving surface of the photosensor 3 which is located on the same side as the light source 1, 10.

A light reception pattern is formed on the photosensor 3 in such a way that the photosensor 3 receives a predetermined portion of this diffraction interference pattern.

In the example in FIGS. 16A and 16B, the photosensor 3 is arranged at the position equivalent to the position of a photosensor 33 folded with respect to the scale surface to cope with the possible case where the light beam emitted from the light source 1, 10 is diffracted on the scale 2 and passes through the opposite side to the light source 1, 10 with respect to the scale 2.

Reference numeral "11" in FIGS. 16A and 16B denotes a block for integrating and securing the light source 1, 10 and the photosensor 3.

The operation of the ninth embodiment of this invention will now be discussed.

The photosensor 3 outputs a periodic output every time the scale 2 is displaced by p1 in the x direction as indicated by an output curve 13 in FIGS. 16A and 16B.

Although the pitch of the diffraction interference pattern on the light receiving surface slightly changes as given by the equation (3) when the distance z1 between the scale 2 and the light source 1, 10 is increased by Δz as illustrated, this structure has an advantage of reducing a change in the pitch of the diffraction interference pattern as apparent from the following equation (4) as compared with the case where the photosensor 3 is arranged on the opposite side to the light source with respect to the scale 2.

$$p2' = p1(z1 + \Delta z + z2 + \Delta z)/(z12 + \Delta z) \qquad (4)$$
$$= p1(z1 + z2 + 2\Delta z)/(z1 + \Delta z)$$

Under the condition of z1=z2, particularly, even if there has occurred a change Δz in the distance between the scale 2 and the light source 1, 10, the pitch of the diffraction interference pattern on the light receiving surface does not deviate as apparent from the equation (3). It is thus desirable that the arrangement should be made under the condition of z1=z2.

It is to be noted however that this structure still has such a problem that when the distance z1 between the scale 2 and the light source 1, 10 is increased by Δz as illustrated, the position of the diffraction interference pattern on the light receiving surface deviates, so that the output curve 13 of the sensor is shifted by Δxb as indicated by an output curve 14.

This embodiment can be modified in various forms.

The structures and arrangement of the light source, the scale and the photosensor in this embodiment can be modified as those of the second to sixth embodiments, thereby additionally providing the above-described effects associated with those embodiments.

The scheme of tilting the light beam emitted from the surface emitting laser light source with respect to the scale surface may be implemented by using optical parts (e.g., a prism) which deflects the optical axis as shown in FIG. 14 as well as tilting the direction of the light source as shown in FIGS. 16A and 16B.

(Tenth Embodiment)

An optical displacement sensor according to a tenth embodiment of this invention will now be discussed with reference to FIGS. 17A and 17B.

The description of those portions which are common to those of the ninth embodiment will be partly omitted below.

Although the ninth embodiment has not defined the structure where the principal axis of the light beam from the light source is set perpendicular to a specific direction of the scale surface, the pitch direction of the diffraction grating formed on the scale is arranged perpendicular to the principal axis of the light beam which is emitted from the light source 1, 10 that emits the coherent light and the surface where the diffraction grating of the scale 2 is formed is arranged in parallel to the light receiving surface of the photosensor according to the tenth embodiment.

Therefore, a direction perpendicular to the pitch direction of the diffraction grating formed on the scale 2 and the principal axis of the light beam emitted from the light source that emits coherent light are tilted by an angle φ.

The operation of the tenth embodiment of this invention will now be discussed.

According to this embodiment, as the principal axis of the light beam is set perpendicular to the pitch direction of the diffraction grating, even if the distance between the scale 2 and the light source 1, 10 changes by Δz, so that a deviation of the peak position of the diffraction interference pattern on the light receiving surface can mostly be neglected by restricting the distribution of the light receiving areas to the vicinity of the principal axis of the light beam because the diffraction interference pattern is symmetrical on the xz plane to the principal axis of the light beam as shown in FIG. 17A.

This brings about such an advantage that a variation of Δz, if occurred at the time of sensing, hardly affect the detection of the amount of movement in the x diffraction.

The use of the surface emitting laser which has a beam spread width corresponding to the distribution of the light receiving areas in the vicinity of the principal axis of the light beam can permit the effective use of the intensity of the laser light, thereby ensuring sensing with a high S/N ratio.

Because the principal axis of the light beam and the direction perpendicular to the pitch direction of the diffraction grating are inclined and the structure is of a reflection type in the ninth embodiment, like the eighth embodiment, this embodiment has advantages such that even if a deviation of Δz occurs at the time of sensing, a variation in the output of the light source caused by the light returning from the scale 2 or the photosensor 3 is small and a change in the pitch of the diffraction interference pattern on the light receiving surface is small.

Particularly, setting z1 equal to z2 can ensure stable sensing such that even if a deviation of Δz occurs at the time of sensing, the pitch and the peak position of the diffraction interference pattern hardly change.

This embodiment can be modified in various forms.

The structures and arrangement of the light source, the scale and the photosensor in this embodiment can be modified as those of the second to sixth embodiments, thereby additionally providing the above-described effects associated with those embodiments.

The scheme of tilting the light beam emitted from the surface emitting laser light source with respect to the scale surface may be implemented by using optical parts (e.g., a prism) which deflects the optical axis as shown in FIG. 14 as well as tilting the direction of the light source as shown in FIGS. 17A and 17B.

(Eleventh Embodiment)

Figures 18A, 18B:
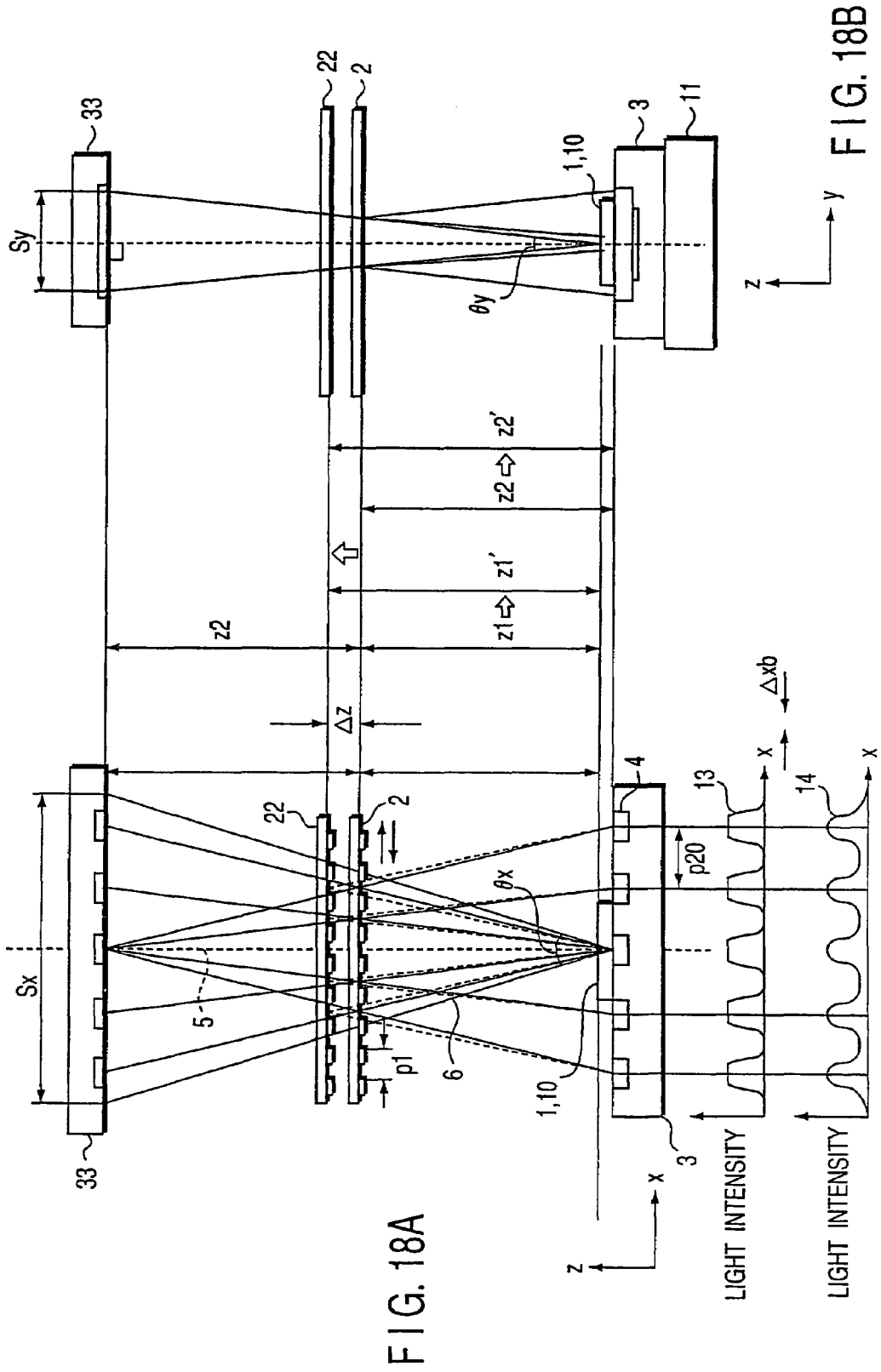
FIGS. 18A and 18B, which illustrate the schematic structure of an optical displacement sensor according to an eleventh embodiment, are respectively a cross-sectional view of an xz plane of the optical displacement sensor according to the eleventh embodiment and a cross-sectional view of a yz plane corresponding to FIG. 18A.

An optical displacement sensor according to an eleventh embodiment of this invention will now be discussed with reference to FIGS. 18A and 18B.

The description of those portions which are common to those of the tenth embodiment will be partly omitted below.

According to this embodiment, the pitch direction of the diffraction grating formed on the scale is arranged perpendicular to the principal axis of the light beam which is emitted from the light source 1, 10 that emits the coherent light and the surface where the diffraction grating of the scale 2 is formed is arranged in parallel to the light receiving surface of the photosensor 3.

The operation of the eleventh embodiment of this invention will now be discussed.

Because of the reflection type structure, this embodiment, like the tenth embodiment, has advantages such that even if the distance between the scale 2 and the light source 1, 10 is changed, a variation in the pitch of the diffraction interference pattern becomes smaller and the deviation of the peak position of the diffraction interference pattern becomes smaller in the vicinity of the principal axis of the light beam, as compared with the transmission type structure used in the prior arts.

Particularly, the use of the surface emitting laser which has a beam spread width corresponding to the distribution of the light receiving areas in the vicinity of the principal axis of the light beam can permit the effective use of the intensity of the laser light, thereby ensuring sensing with a high S/N ratio.

According to the embodiment, as $\phi=0$, it should be noted that return light noise is generated by the light that returns to the light source from the scale or the light receiving surface when z1 is small. In the usage where such noise generation is negligible, however, this embodiment has an advantage such that the structure becomes simpler.

Even if z1 is small, the noise that is caused by the light returning to the light source from the scale or the light receiving surface is reduced by subjecting the top and bottom surfaces of the scale or the light receiving surface to an optical process of reducing the reflection, this structure can be adapted for any use where the return light noise is negligible.

Particularly, setting z1 equal to z2 can ensure stable sensing such that even if a deviation of $\Delta z$ occurs at the time of sensing, the pitch and the peak position of the diffraction interference pattern hardly change.

(Twelfth Embodiment)

Figure 19C:
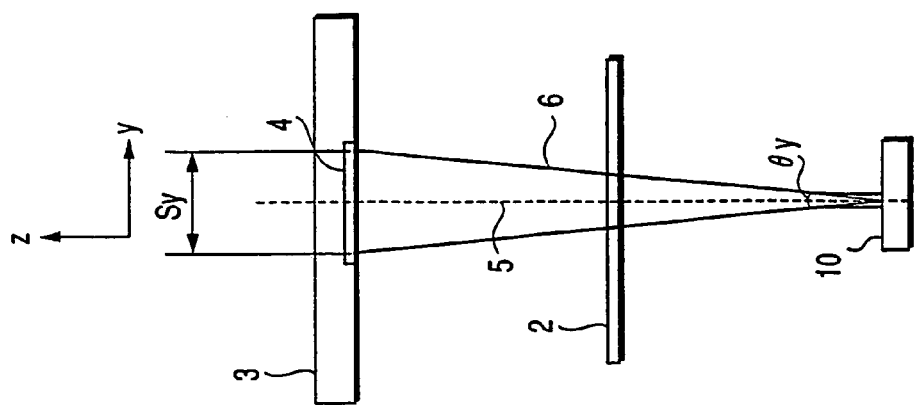
FIGS. 19A to 19C, which illustrate the schematic structure of an optical displacement sensor according to a twelfth embodiment of this invention, are respectively a perspective view showing the twelfth embodiment, a cross-sectional view of an xz plane corresponding to FIG. 19A and a cross-sectional view of a yz plane corresponding to in FIG. 19A.
Figure 19B:
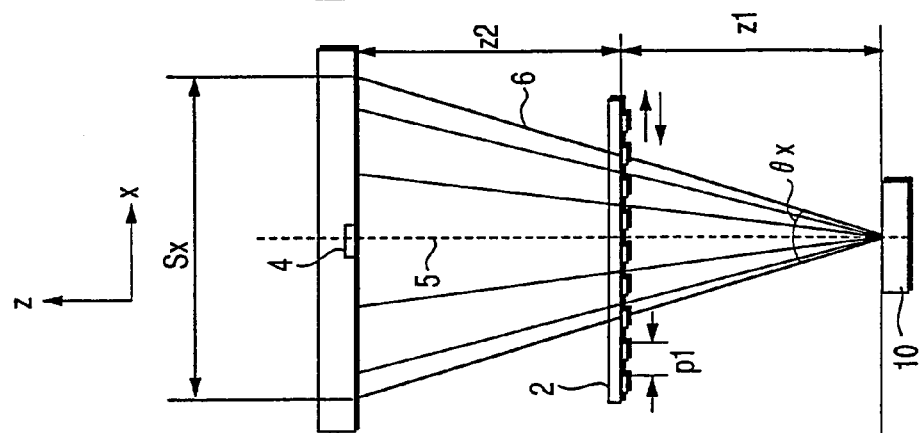
Figure 19A:
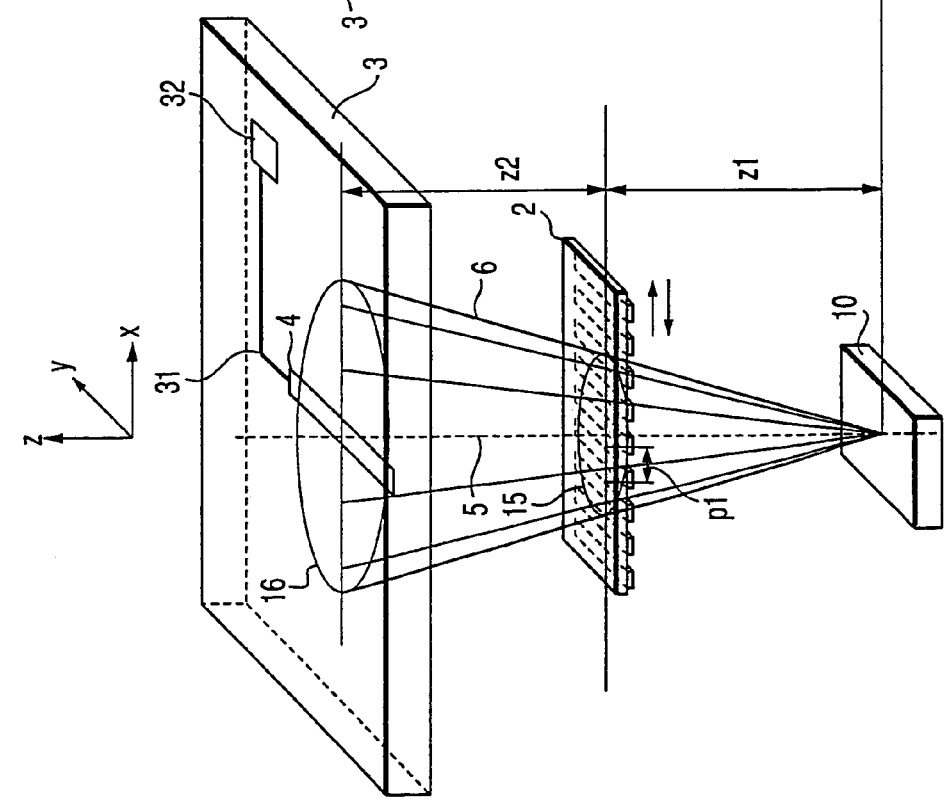

An optical displacement sensor according to a twelfth embodiment of this invention will now be discussed with reference to FIGS. 19A to 19C.

The description of those portions which are common to those of the first embodiment will be partly omitted below.

This twelfth embodiment is a special case of the first embodiment where there is a single light receiving area, and is the same as the first embodiment otherwise.

With regard to the ninth embodiment described previously from a different aspect relating to the structure of an optical encoder that can be used as an optical displacement sensor will now be described.

FIGS. 16A and 16B show the structure of the optical encoder according to the ninth embodiment from a different point of view.

As shown in FIGS. 16A and 16B, the optical encoder is constructed in such a way that a laser beam emitted from a semiconductor laser 1 (or a surface emitting laser 10) which is a coherent light source is irradiated on a transmission type diffraction grating scale 2, forming a diffraction interference pattern, and a specific portion of the diffraction interference pattern is detected by either the photosensor 3 or a photosensor 33.

In the following description, the coherent light source may simply be called a light source in some cases.

Where the coherent light source of the semiconductor laser 1 and the photosensor 3 are arranged on the same side with respect to the scale 2, a principal axis 5 of the light beam emitted from the semiconductor laser 1 (or the surface emitting laser 10) is inclined by an angle $\phi$ to the line perpendicular to the surface of the scale 2, as shown in FIG. 16A.

The operation of the optical encoder of this particular structure which can be used as an optical displacement sensor will now be described.

As shown in FIG. 16A, the individual structural parameters are defined as follows as described previously:

z1: distance between the light source and the surface of the scale 2 having a diffraction grating formed thereon measured along the principal axis of the light beam;

z2: distance between the surface of the scale 2 having a diffraction grating formed thereon and the light receiving surface of the photosensor 3 measured along the principal axis of the light beam;

p1: pitch of the diffraction grating formed on the scale 2;

p2: pitch of the diffraction interference pattern on the light receiving surface of the photosensor 3;

$\theta x$: spread angle of the light beam of the light source with respect to the pitch direction of the diffraction grating on the scale 2;

$\theta y$: spread angle of the light beam of the light source in a direction perpendicular to $\theta x$ given above.

The spread angle of the light beam represents an angle made by a pair of boundary lines 6 at which the intensity of the light beam becomes a half in a direction in which the intensity forms a peak.

It should be noted that the "pitch of the diffraction grating on the scale 2" represents the spatial period of a pattern formed by modulating the optical characteristics formed on the scale 2. Also, the "pitch of the diffraction interference pattern on the light receiving surface of the photosensor 3" represents the spatial period of the intensity distribution of the diffraction interference pattern formed on the light receiving surface.

According to the diffraction theory of light, an intensity pattern similar to the diffraction grating pattern of the scale is formed on the light receiving surface of the photosensor, if z1 and z2 meet the relationship given by the equation (1).

In this case, the pitch p2 of the diffraction interference pattern on the light receiving surface can be represented by the equation (2) by using the other structural parameters.

If the scale 2 is displaced with respect to the light source 1 in the pitch direction of the diffraction grating, the intensity distribution of the diffraction grating pattern is moved in a direction of displacement of the scale while maintaining the same spatial period.

Therefore, if the spatial period p20 of the light receiving area 4 of the photosensor 3 is set at a value equal to that of p2, a periodic intensity signal is obtained every time the scale 2 is moved by p1 in the pitch direction, making it possible to detect the amount of displacement of the scale 2 in the pitch direction.

If the light source 1 and the photosensor 3 are arranged on the same side relative to the scale 2 in such a way that z1 is equal to z2 (z1=z2), as shown in FIGS. 16A and 16B, the pitch of the diffraction interference pattern on the light receiving surface remain unchanged as apparent from the equation (2) even if the spatial gap between the scale 2 and the light source 1 is changed.

Further, in practice, a group of the light receiving elements, each having a spatial period P20, of the photosensor is shifted by a distance of P20/4 to form four groups of light receiving elements that are arranged alternately. In this case, Va–Va' and Vb–Vb', where Va, Vb, Va' and Vb' represent the outputs of the light receiving elements of the four groups, respectively, are utilized as so-called "phase A" (sine wave) output and "phase B" (cosine wave) output of the encoder.

In this invention to be described later, the intensity of the laser beam can be monitored by calculating the sum of the outputs Va, Vb, Va', Vb', making it possible to correct to some extent the influence of a change in environment and a time-dependent change on the change in intensity of the laser beam by feeding back the sum to make constant the change in intensity of the laser beam caused by the change in environment and by the time-dependent change, or by performing an adequate arithmetic operation on the output signal of the phase A (or phase B) and the signal of the sum of the individual outputs Va, Vb, Va' and Vb'.

In the ninth embodiment described previously, the principal axis 5 of the light beam is held perpendicular to the pattern direction of the scale as shown in FIG. 16B.

Suppose, in the ninth embodiment, the relationship between z1 and z2 fails to meet the equation (1) because of the initial arrangement error in assembling the optical encoder that can be used as an optical displacement sensor and because of the mechanical swinging caused by the displacement of the scale.

As one example, suppose that the photosensor 3 arranged on the same side as the light source with respect to the scale is used.

Figure 32B:
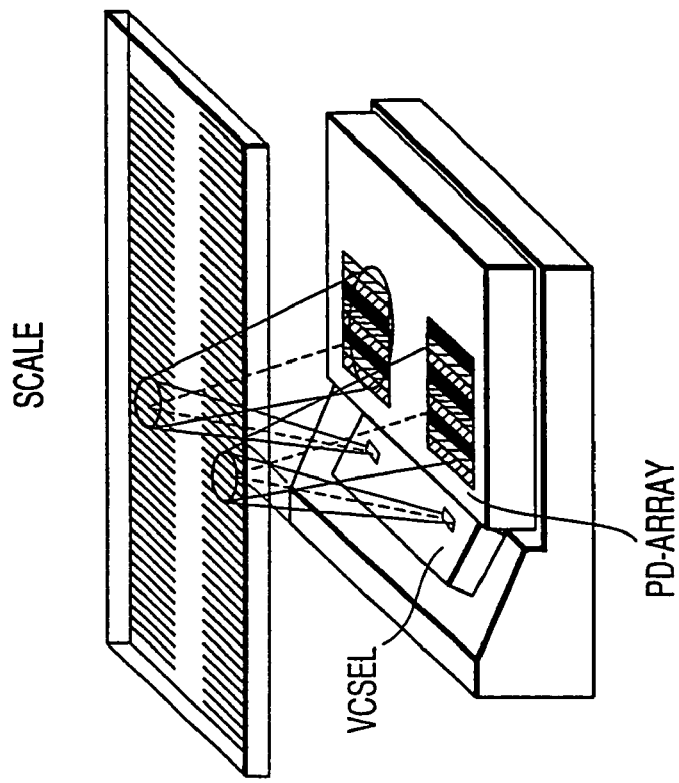
FIGS. 32A and 32B are diagrams for explaining the simplest modes in the case of expanding the structure of shown in FIGS. 16A and 16B into the multi-beam & track configuration.
Figure 32A:
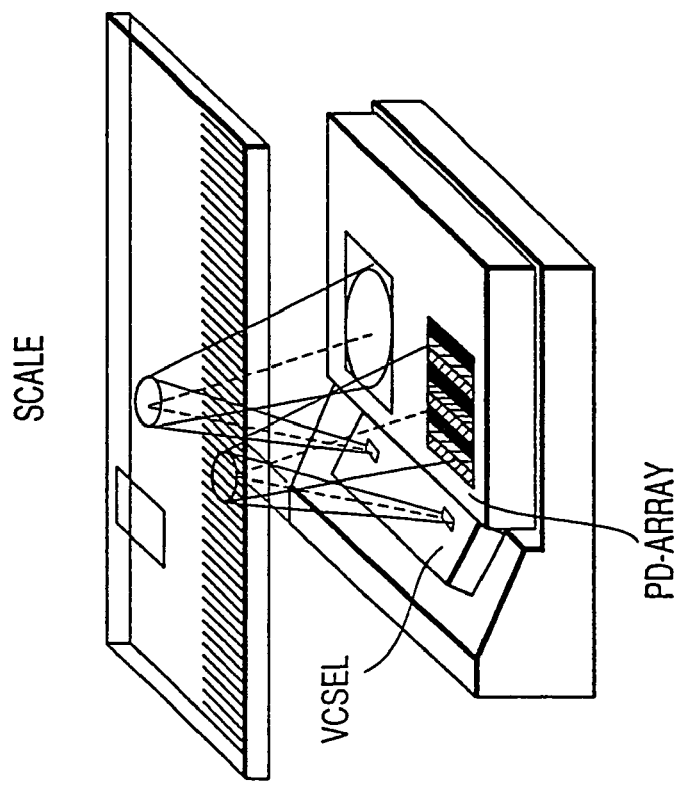

For example, where the light source and the light receiving surface are fixed and the scale is deviated by Δz from the position of the scale 2 to the position of the scale 22, i.e., where the gap between the sensor head and the scale has been changed, the light intensity distribution shown in FIG. 32A is changed from a curve 13 to curve 14. In other words, the output of the encoder is changed not only because the diffraction interference pattern on the light receiving surface is slightly disturbed but also because the position of the diffraction interference pattern on the light receiving surface is moved in an x direction.

Therefore, if the displacement of the scale in the x direction is measured in the ninth embodiment, an error is generated due to the change in the gap between the scale and the head.

If each of a plurality of tracks differing from one another in the scale pattern is irradiated with a laser beam, it is possible to realize the reference point detecting function and the absolute position detecting function. For the encoder of the ninth embodiment, however, here has been proposed no scheme of providing a plurality of scale patterns so as to add the reference point detecting function and the absolute position detecting function.

In order to allow the encoder to perform these functions while avoiding the influences inherent in the ninth embodiment, which are caused by a change in the gap between the scale and the head, a special structure is required as described in the later section in conjunction with the means for their solution given by this invention.

The structure that a plurality of tracks differing from one another in the scale pattern is irradiated with a laser beam is called herein "multi-beam & track configuration" for the sake of simplicity.

The structures shown in FIGS. 32A and 32B are considered to be the simplest types in the case where the structure of the ninth embodiment described previously is expanded into the multi-beam & track configuration.

FIG. 32A covers the case where one of the multi-tracks forms a single pattern for detecting the reference point detection.

Likewise, FIG. 32B covers the case where one of the multi-tracks is formed into a diffraction pattern formed at a pitch differing from the pattern of the other tracks. In this case, the absolute value can be measured by the principle of vernier encoder within a range of movement of the scale that is the least common multiple of both pitches.

If the displacement of the scale in the x direction is to be measured in these structures, however, the diffraction interference pattern is moved in the x direction on the light receiving surface under the influence caused by the change in the gap between the scale and the head, as described previously. As a result, a measuring error in the displacement in the x direction is inevitable.

A second problem to be considered is that it is necessary to arrange in an inclined fashion the laser light emitting surface of the light source, the scale surface and the light receiving surface of the photosensor, making it difficult to assemble the optical encoder used as an optical displacement sensor.

In the actual manufacturing process, it is necessary to carry out die bonding of the inclined substrate surface of the semiconductor laser 1 (or surface emitting laser 10) and further wire bonding of wirings to the inclined semiconductor laser electrodes under observation by a microscope.

In these assembling steps, a tool for correcting the inclination is required. It is also necessary to move the focal point of the microscope up and down for the microscopic observation of the inclined parts. This makes the assembling steps highly difficult, leading to a longer assembling time and a higher assembling cost.

A third problem of the ninth embodiment is that, in practical use of the encoder, swinging is caused in accordance with the feedback of the output of the light source and the movement of the scale at the time of correction because the sum of the outputs Va, Vb, Va', Vb', which is used in detecting the intensity of the laser light, is slightly changed when the scale is moved. The exact reason for the difficulty is unknown, but it seems reasonable to understand that the interference pattern on the light receiving surface is slightly deviated from the theoretic shape.

(Thirteenth Embodiment)

Figures 21B, 21C:
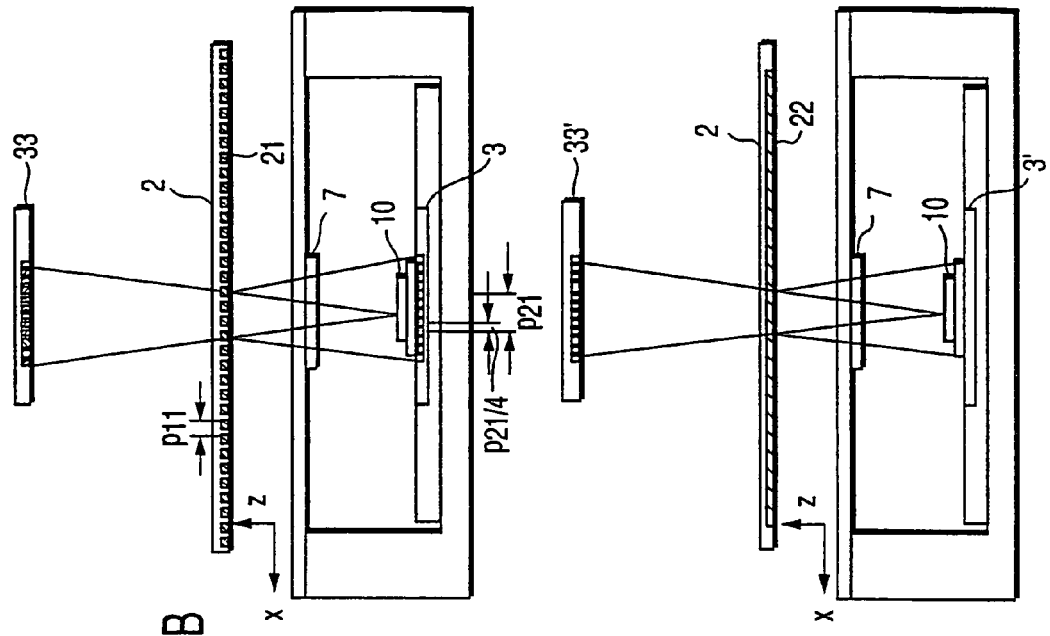
FIGS. 21A to 21C, which illustrate the structure of an optical displacement sensor to be used as the optical encoder according to the thirteenth embodiment of this invention, are respectively a plan view showing the scale 2 in the thirteenth embodiment as viewed towards a −z direction, a cross-sectional view of an xz plane corresponding to the cross section along a1–a1' in FIG. 21A and a cross-sectional view of an xz plane corresponding to the cross section along a2–a2' in FIG. 21A.
Figure 21A:
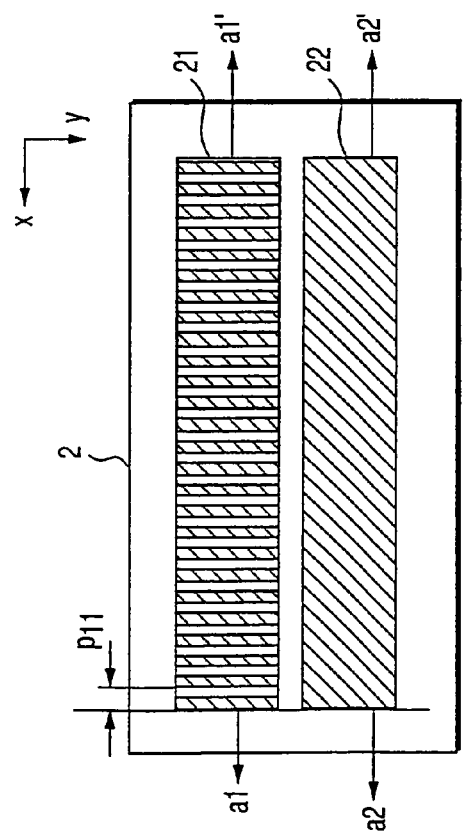

FIGS. 20A and 20B illustrate the structure of an optical displacement sensor to be used as an optical encoder according to the thirteenth embodiment of this invention. FIGS. 21A to 21C illustrate the structure of an optical displacement sensor to be used as the optical encoder according to the thirteenth embodiment of this invention so as to achieve the fourth to sixth subject matters described above.

FIGS. 20A and 21A are plan views showing the scale 2 in the thirteenth embodiment and a modification thereof as viewed towards the −z direction. FIG. 20B is a cross-sectional view of the yz plane in this embodiment.

FIG. 21B is a cross-sectional view of the xz plane corresponding to the cross section along a1–a1' in FIG. 21A showing this embodiment. FIG. 21C is likewise a cross-sectional view of the xz plane corresponding to the cross section along a2–a2' in FIG. 21A.

The thirteenth embodiment of this invention is constructed as follows.

As shown in FIG. 20B, the laser beam emitted from the surface emitting laser 10 as the coherent light source is split into at least two components by a diffraction grating 7 which is used as a beam-splitting optical element.

In FIG. 20B, the principal axis of the first light beam immediately after being split is indicated by a solid line 5, and the principal axis of the second light beam immediately after being split is indicated by a solid line 5'.

Those first and second light beams are respectively irradiated on the first and second scale patterns 21 and 22 on the scale 2 and are returned along the lines indicated by the principal axes 15 and 15' of the light beams to be respectively received by first photosensors 3 and 3' (this case will hereinafter be called a reflection type structure), or pass through the scale 2 along the principal axes 25 and 25' of the light beams to be respectively received by second photosensors 33 and 33' (this case will hereinafter be called a transmission type structure).

In the reflection type structure of this embodiment, the first scale pattern 21 has a period of p11 in the x direction and has a reflectance which changes periodically, while the second scale pattern 22 has a uniform reflectance.

In the transmission type structure, the first scale pattern 21 has a period of p11 in the x direction and has a transmissivity which changes periodically, while the second scale pattern 22 has a uniform transmissivity.

As shown in FIG. 20B, the photosensor 3 is adhered to a casing 11 and the surface emitting laser 10 is mounted on the surface of the photosensor 3.

A transparent cover 61 which serves to both seal the optical displacement sensor which is used as an optical encoder according to the thirteenth embodiment and to secure the diffraction grating is located on the top surface of the casing 11.

As shown in FIG. 21B, the first photosensor 3 or 33 has groups of strip-like light receiving areas with a period of p21 where p21 is approximately np11(z11+z21)/z11. In this embodiment, n is set equal to 1.

A solid line 6 indicates the boundary line defining the spreading of the light beam.

The operation of the thirteenth embodiment of this invention and its modification will now be discussed.

The interference pattern generated by the first light beam produces a diffraction interference pattern with a period p21 on the light receiving surface of the first photosensor 3 or 33 in the x direction.

Normally, there are four groups of light receiving areas arranged at distances of p21/4 as shown in FIG. 21B, and those groups respectively output signals of phase A, phase B, phase/A and phase/B as so-called encoder signals.

That is, as the scale 2 is shifted by p11 in the x direction, periodic outputs whose phases differ from the phase A, phase B, phase/A and phase/B by ¼ period are acquired.

Because the second scale pattern is a uniform optical pattern, the output of the second photosensor 3' or 33' becomes proportional to the beam output.

When the beam output varies due to an environmental change or with the passage of time, the output of the second photosensor 3' or 33' is fed back to the driving unit for the coherent light source 1 to suppress a variation in the output or the encoder output signals are compensated by using the output of the second photosensor 3' or 33', thereby always ensuring stable sensing of the displacement of the scale 2.

To optimally adjust the optical distance of the principal axis of the light beam that travels from the light source 1, 10 to the scale 2 and the optical distance of the principal axis 15, 15' of the light beam that travels from the scale 2 to the first photosensor 3 or 33 (this adjustment will hereinafter be called optical distance adjustment), it is desirable to set the thickness t of the diffraction grating 7.

The individual components of the thirteenth embodiment of this invention can of course be changed or modified in various forms.

While the surface emitting laser 10 is exemplified as the coherent light source, an ordinary edge emitting type semiconductor laser or other coherent light sources may be used as well.

Although the diffraction grating 7 is exemplified as the beam-splitting optical element, another optical element such as a prism or half mirror may be used as well.

The aforementioned optical distance adjustment is not limited to the adjustment of the thickness of the diffraction grating but an optical medium with a different reflectance may be inserted on the optical axis or a part for adjusting the heights of the light source and the photosensor may be attached.

(Fourteenth Embodiment)

Figure 22B:
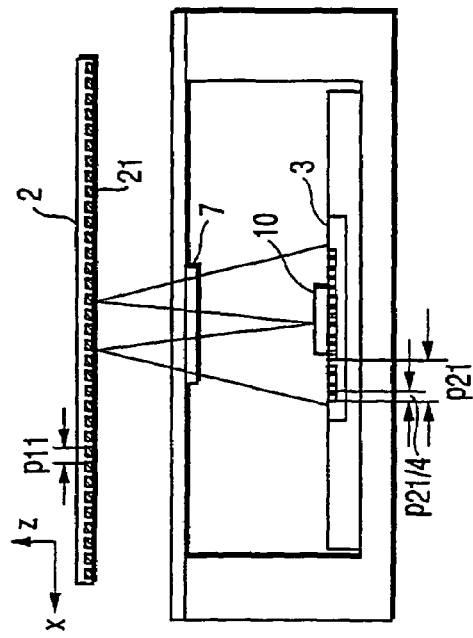
FIGS. 22A to 22C, which illustrate the structure of an optical displacement sensor to be used as an optical encoder according to a fourteenth embodiment of this invention, are respectively a plan view showing the scale 2 in the fourteenth embodiment as viewed from a −z direction, a cross-sectional view of an xz plane corresponding to the cross section along a1–a1' in FIG. 22A and a cross-sectional view of an xz plane corresponding to the cross section along a2–a2' in FIG. 22A.
Figure 22C:
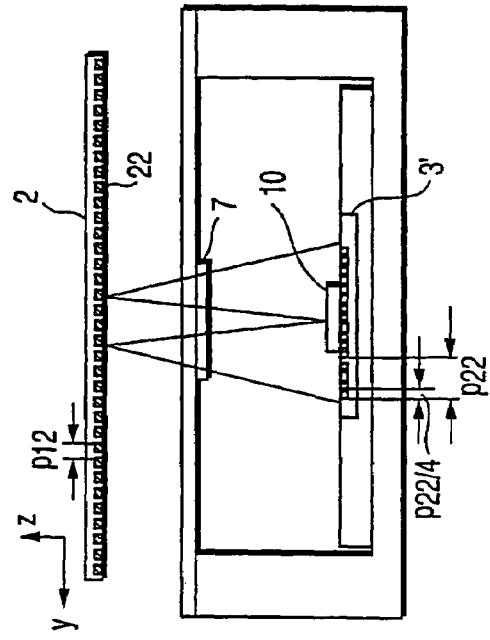
Figure 22A:
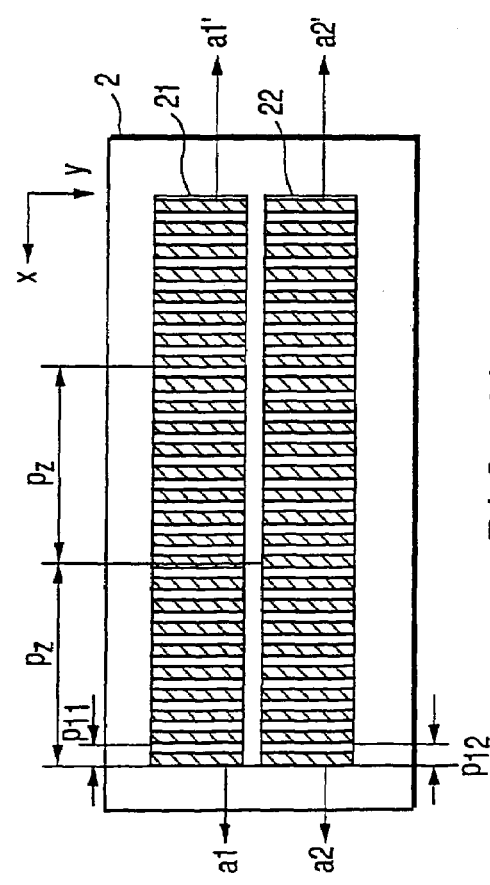

FIGS. 22A to 22C illustrate the structure of an optical displacement sensor to be used as an optical encoder according to the fourteenth embodiment of this invention.

The cross-sectional structure in the yz plane according to this embodiment is the same as that of FIG. 20B, and the behavior of the principal axis of the light beam that travels from the coherent light source 1 to the first photosensor 3 is the same as that of the thirteenth embodiment in the optical sense.

The mode and operation for the first light beam to reach the first photosensor 3 through the scale 2 and acquiring the encoder signals from this photosensor 3 are also the same as those of the thirteenth embodiment.

The following section of this embodiment will therefore discuss only the difference where the second scale pattern 22 differs from that of the thirteenth embodiment.

FIG. 22A is a plan view showing the scale 2 in the fourteenth embodiment as viewed from the −z direction. FIG. 22B is a cross-sectional view of the xz plane corresponding to the cross section along a1–a1' in FIG. 22A. FIG. 22C is a cross-sectional view of the xz plane corresponding to the cross section along a2–a2' in FIG. 22A.

The fourteenth embodiment of this invention is constructed as follows.

The pitch p12 of the second scale pattern 22 is made different from the pitch p11 of the first scale pattern 21.

In accordance with this difference, the light receiving areas are formed like strips in cross section in the xz plane which corresponds to the cross section along a2–a2' as shown in FIG. 22C, with the pitch being p22 in association with the pitch of the second scale pattern, and groups of light receiving areas are deviated from one another by p22/4.

The deviation p22 of the groups of light receiving areas is approximately p12(z12+Z22)/Z12.

The operation of the fourteenth embodiment of this invention will now be discussed.

The second light beam forms a diffraction interference pattern on the light receiving surface of the second photosensor 3' in the same manner as the first light beam forms a diffraction interference pattern on the light receiving surface of the first photosensor 3, and the second photosensor 3' provides a period output signal every time the scale 2 is shifted by p12 in the x direction.

Because the intensities of the outputs of the first photosensor 3 and the second photosensor 3' change at the respective periods of p11 and p12 in the pitch direction of the scale 2, therefore, the absolute position detecting function can be added within the range of the movement of the scale that is the least common multiple of p11 and p12 based on the principle of the vernier encode.

The individual components of the fourteenth embodiment of this invention can of course be changed or modified in various forms.

For example, the number of light beams to be split may be set to two or greater and scale patterns and photosensors which correspond in number to that number should be provided.

(Fifteenth Embodiment)

FIGS. 23A to 23C illustrate the structure of an optical displacement sensor to be used as an optical encoder according to the fifteenth embodiment of this invention.

The cross-sectional structure in the yz plane according to this embodiment is the same as that of FIG. 20B, and the behavior of the principal axis of the light beam that travels from the coherent light source 1 to the first photosensor 3 is the same as that of the thirteenth embodiment in the optical sense.

The mode and operation for the first light beam to reach the first photosensor 3 through the scale 2 and acquiring the encoder signals from this photosensor 3 are also the same as those of the thirteenth embodiment.

The following section of this embodiment will therefore discuss only the difference where the second scale pattern 22 differs from that of the thirteenth embodiment.

FIG. 23A is a plan view showing the scale 2 in the fifteenth embodiment as viewed from the −z direction. FIG. 23B is a cross-sectional view of the xz plane corresponding to the cross section along a1–a1' in FIG. 23A. FIG. 23C is a cross-sectional view of the xz plane corresponding to the cross section along a2–a2' in FIG. 23A.

The fifteenth embodiment of this invention is constructed as follows.

The second scale pattern 22 is formed by an optical pattern having a period pz at a specific reference position.

In accordance with this difference, the cross-sectional structure in the xz plane which corresponds to the cross section along a2–a2' is the same as that of the thirteenth embodiment as shown in FIG. 23C.

The operation of the fifteenth embodiment of this invention will now be discussed.

When the second light beam is irradiated on the portion at which the reflectance or transmissivity of the second scale pattern 22 changes, the output of the second photosensor 3' changes. Therefore, the reference point detecting function can be added by previously forming the portion where the reflectance or transmissivity of the second scale pattern 22 changes at the desired position.

The individual components of the fifteenth embodiment of this invention can of course be changed or modified in various forms.

The second scale pattern 22 may has a single pattern or may have a plurality of patterns formed at reference point intervals according to the usage.

The number of light beams to be split may be set to two or greater and scale patterns and photosensors which correspond in number to that number should be provided.

(Sixteenth to Eighteenth Embodiments)

Figures 24A, 24B, 24C, 24D:
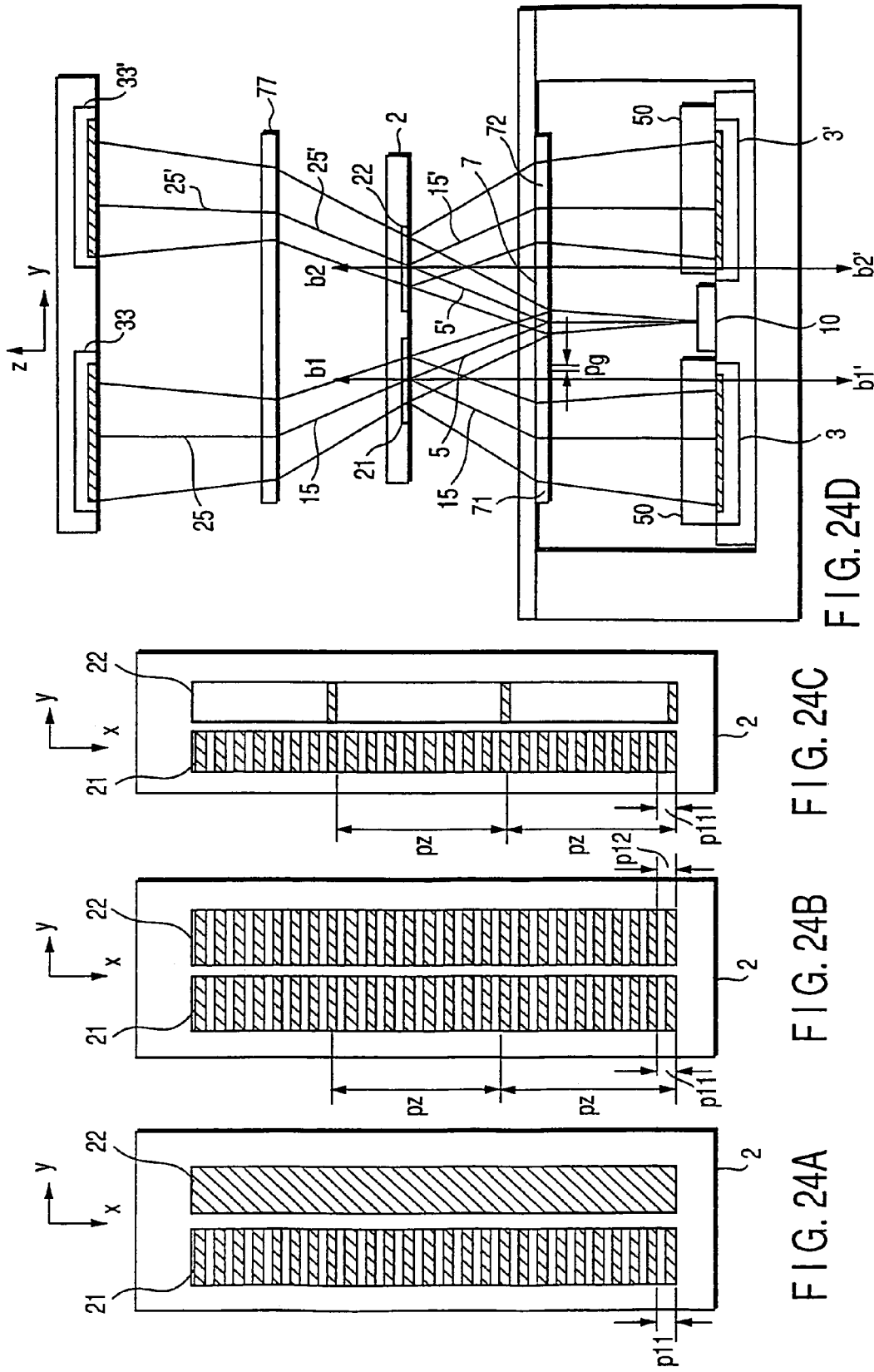
FIG. 24A is a plan view showing the scale 2 in a sixteenth embodiment as viewed from a −z direction.
FIG. 24B is a plan view showing the scale 2 in a seventeenth embodiment as viewed from a −z direction.
FIG. 24C is a plan view showing the scale 2 in an eighteenth embodiment as viewed from a −z direction.
FIG. 24D is a cross-sectional view illustrating the structure of the optical displacement sensor which is to be used as the optical encoders according to the sixteenth to eighteenth embodiments of this invention.

FIGS. 24A to 24D illustrate the structures of optical displacement sensors to be used as an optical encoder according to the sixteenth, seventeenth and eighteenth embodiments of this invention. FIGS. 24A to 24C are plan views respectively showing the sixteenth to eighteenth embodiments as viewed from the −z direction.

The sixteenth to eighteenth embodiments have the same cross-sectional structure in the yz plane as shown in FIG. 24D.

With regard to the cross-sections in the xz plane, FIGS. 21B and 21C, FIGS. 22B and 22C and FIGS. 23B and 23C respectively correspond to the sixteenth to eighteenth embodiments.

The sixteenth to eighteenth embodiments of this invention are constructed as follows.

In the sixteenth to eighteenth embodiments, the first scale pattern 21, the second scale pattern 22, the first photosensor 3 or 33 and the second photosensor 3' or 33' are the same as those of the thirteenth to fifteenth embodiments, respectively.

As shown in FIG. 24D, the laser beam emitted from the surface emitting laser 10 as the coherent light source is split into at least two components by a diffraction grating 7 which is used as a beam-splitting optical element.

In FIG. 24D, the principal axis of the first light beam immediately after being split is indicated by a solid line 5, and the principal axis of the second light beam immediately after being split is indicated by a solid line 5'.

Those first and second light beams are respectively irradiated on the first and second scale patterns 21 and 22 on the scale 2 and are returned along the lines indicated by the principal axes 15 and 15' of the light beams, and their optical axes are deflected by diffraction gratings 71 and 72 which are used as first and second optical beam-bending elements, so that the resultant light beams are respectively received by the first photosensors 3 and 3' (this case will hereinafter be called a reflection type structure), or pass through the scale 2 along the principal axes 25 and 25' of the light beams and their optical axes are deflected by a diffraction grating 77 which is used as the first and second optical beam-bending elements, so that the resultant light beams are respectively received by the second photosensors 33 and 33' (this case will hereinafter be called a transmission type structure).

The operation of the sixteenth to eighteenth embodiments of this invention will now be discussed.

The operations of sixteenth to eighteenth embodiments are the same as those of the thirteenth, fourteenth and fifteenth embodiments except for the light beams being deflected by the first and second beam-bending elements 77.

If the pitches pg of the diffraction gratings 7 and 77 which are used as the beam-splitting optical element and the first and second optical beam-bending elements are set equal to each other, the principal axis of the light beam immediately after it has been emitted from the light source 1 becomes in parallel to the principal axis of each light beam that enter the photosensor 3 or the like.

In this case, in FIG. 24D, the principal axis of the light beam that travels from the light source 1 to the scale 2 becomes symmetrical to the principal axis of each light beam that travels from the scale 2 to the photosensor 3 or the like with respect to lines b1–b1' and b2–b2' perpendicularly extending from the points where the first and second light beams intersect the scale 2 to the scale surface. This structure has such an advantage as to facilitate computation to make z11=z21 and z21=z22 in the design.

This can permit easy designing to set z11=z21 and z21=z22 however the deflection angles of the principal axes are set by the beam-splitting optical elements. The sixteenth to eighteenth embodiments therefore are advantageous in designing the gap between the scale and the sensor, the pitch of the scale and so forth with a large degree of freedom.

Of course, the individual components of the sixteenth to eighteenth embodiments of this invention can be changed or modified in various forms.

Where the difference between the imaginary position of the light source and the height of the light receiving surface raises a problem, optical distance adjusting means 50 may be inserted on the optical axis of the light beam to implement the aforementioned optical distance adjustment, as shown in FIG. 24D.

The beam-splitting optical element and the first and second optical beam-bending elements may be formed integrally or separately.

(Nineteenth Embodiment)

Figures 25A, 25B, 25C:
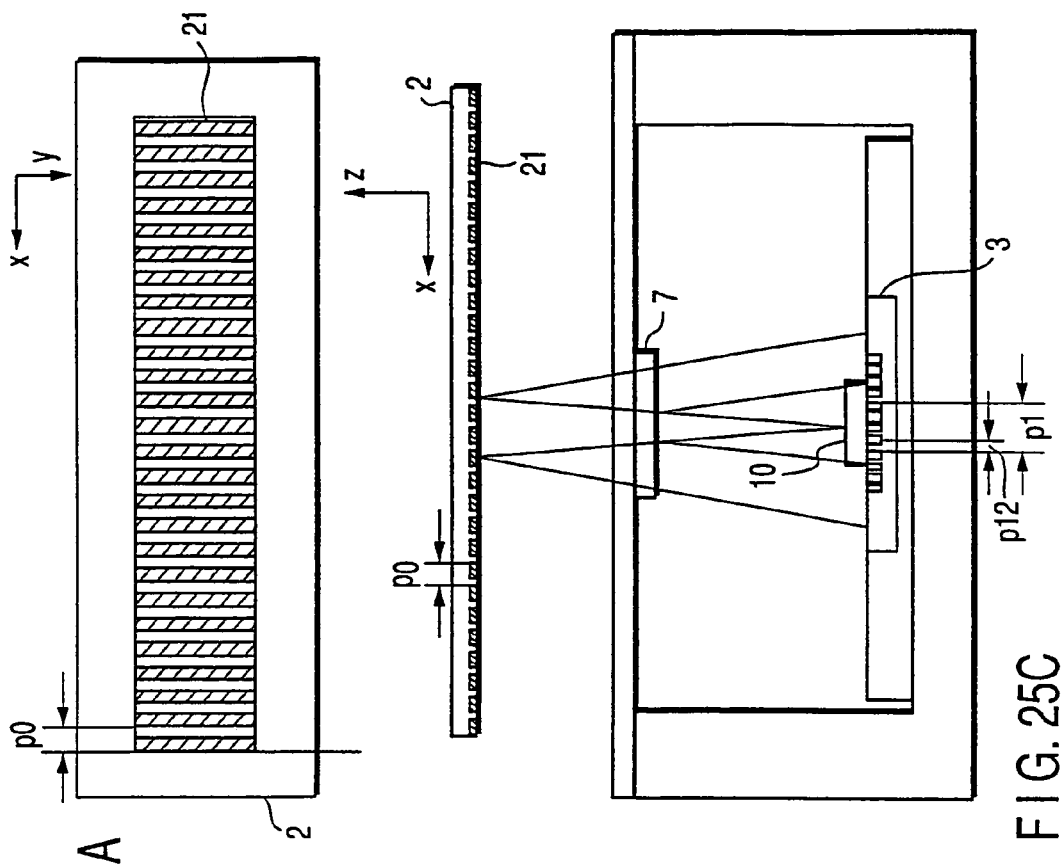
FIGS. 25A to 25C, which illustrate the structure of an optical displacement sensor to be used as an optical encoder according to a nineteenth embodiment of this invention, are respectively a plan view showing the scale 2 in the nineteenth embodiment as viewed from a −z direction, a cross-sectional view of a zy plane and a cross-sectional view of a xz plane.

FIGS. 25A to 25C illustrate the structure of an optical displacement sensor to be used as an optical encoder according to the nineteenth embodiment of this invention.

The behavior of the principal axis of the light beam that travels from a coherent light source 10 to the first photosensor 3 is the same as that of the thirteenth embodiment in the optical sense.

The following will therefore discuss only the difference between the nineteenth embodiment and the thirteenth embodiment.

FIG. 25A is a plan view showing the scale 2 in the nineteenth embodiment as viewed from the −z direction, FIG. 25B a cross-sectional view of the zy plane, and FIG. 25C a cross-sectional view of the xz plane.

The nineteenth embodiment of this invention is constructed as follows.

As shown in FIG. 25A, the scale pattern 21 is so formed as to have a pitch p0 in the x direction.

In accordance with this difference, the light receiving areas are formed like strips in cross section in the xz plane which corresponds to the cross section along c1–c1' as shown in FIG. 25C, with the pitch being p12 in association with the pitch of the second scale pattern, and the deviation of groups of light receiving areas becomes p12/4.

The deviation p12 of the groups of light receiving areas is approximately $np11(z11+Z21)/Z11$.

Though not illustrated, the cross-sectional structure in the xz plane corresponding to the cross section along c2–c2' is such that a single light receiving area is formed on the second photosensor 3' so that the light beam that has been emitted from the light source 10 is caused to directly enter the light receiving area on the second photosensor 3' by the beam-splitting means.

The operation of the nineteenth embodiment of this invention will now be discussed.

First, the light beam that has left the coherent light source 10 has its optical axis bended by the diffraction grating 7 as the beam-splitting means as in the sixteenth to eighteenth embodiments, the resultant light beam then passes the scale 2 and the optical beam-bending elements again before reaching the first photosensor 3.

Then, the mode and operation for acquiring encoder signals from the first photosensor 3 are also the same as those of the sixteenth to eighteenth embodiments.

According to this embodiment, the light beam emitted from the coherent light source 10 is reflected at, passes through or is deflected by the diffraction grating 77 as the beam-splitting optical means, and directly enters the second photosensor 3' where its intensity is detected.

The output of the second photosensor 3' becomes proportional to the beam output.

When the beam output varies due to an environmental change or with the passage of time, the output of the second photosensor 3' is fed back to the driving unit for the coherent light source 10 to suppress a variation in the output or the encoder output signals are compensated by using the output of the second photosensor 3', thereby always ensuring stable sensing of the displacement of the scale 2.

As this embodiment can detect the intensity of the light beam without using the uniform reflectance or transmissivity pattern of the scale 2, it is possible to suppress an error in detection caused by a variation in the intensity of the light beam, reliably without depending on a defect, dust or stain.

Of course, the individual components of the nineteenth embodiment of this invention can be changed or modified in various forms in accordance with the above-described thirteenth to eighteenth embodiments.

(Twentieth Embodiment)

Figure 26:
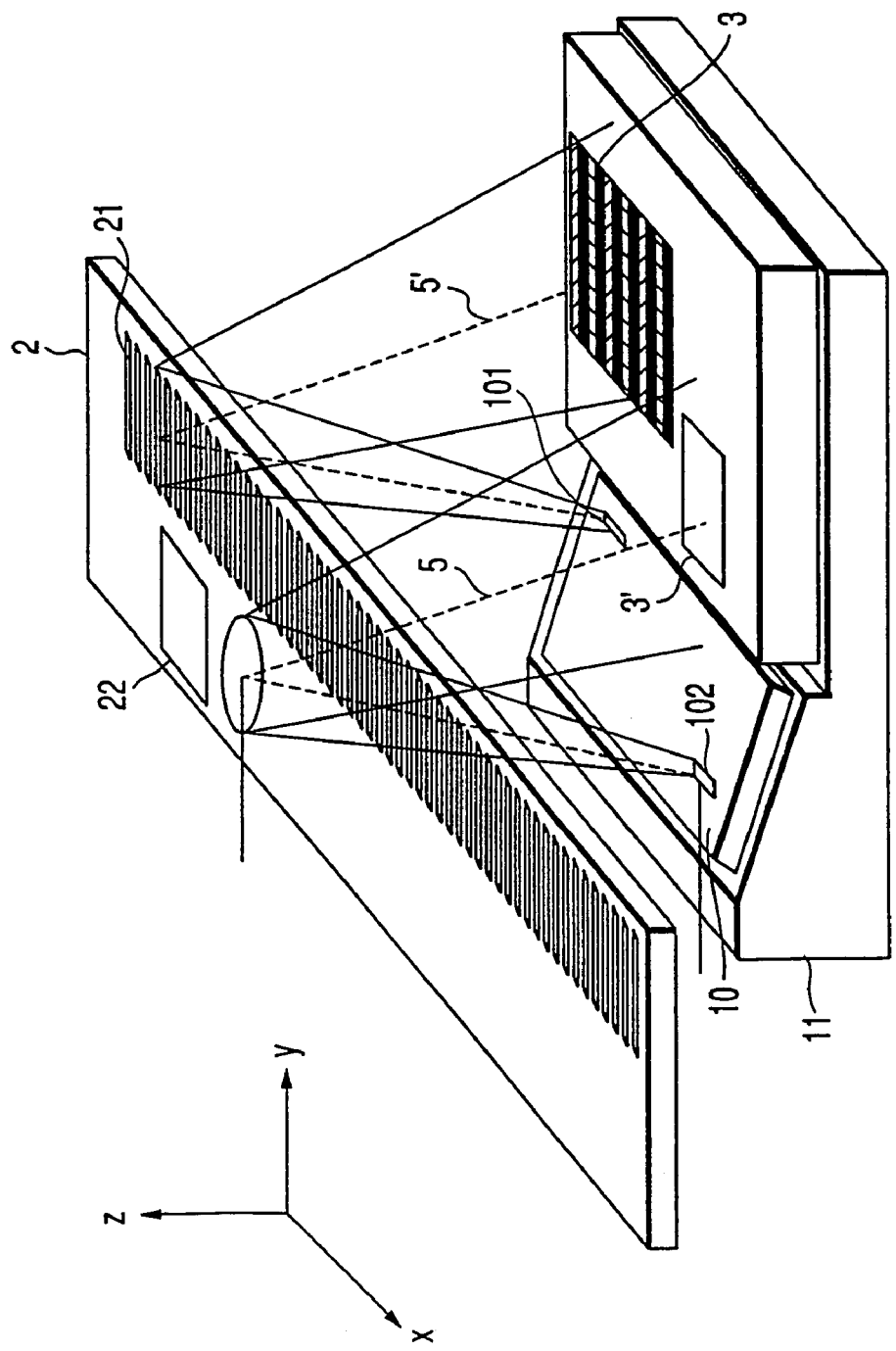
FIG. 26 is a perspective view illustrating the structure of an optical displacement sensor to be used as an optical encoder according to a twentieth embodiment of this invention.

FIG. 26 illustrates, as a perspective view, the structure of an optical displacement sensor to be used as an optical encoder according to the twentieth embodiment of this invention The scale 2 has two scale patterns 21 and 22, the first scale pattern 21 so formed as to have a pitch p11 in the x direction while the second scale pattern 22 is formed as a single pattern with the adequate width for detecting the reference point.

The surface emitting laser 10 which is used as the coherent light source is so designed as to emit two light beams from different coordinates in the x direction and y direction as shown in FIG. 26.

The first light beam is irradiated on the first scale pattern 21, thereby forming a diffraction interference pattern on the light receiving surface of the first photosensor 3.

The second light beam is irradiated on the second scale pattern 22, and its reflected light is detected by the second photosensor 3.

The surface emitting laser light source 10 is arranged in such a way as to include the principal axis 5 of the light beam emitted from the light source 10 and to be tilted only within the plane perpendicular to both the scale surface and the spatial period direction of the first scale pattern 21.

The operation of the twentieth embodiment of this invention will now be discussed.

The first light beam emitted from the beam-emitting window 101 of the surface emitting laser light source 10 passes through the first scale pattern 21, forming a diffraction pattern on the light-receiving surface of the first photosensor 3. The first photosensor 3 generates an encoder signal in the same way as in the first to nineteenth embodiments described above.

The second light beam emitted from the beam-emitting window 101 of the surface emitting laser light source 10 is applied to the second scale pattern 22 and reflected therefrom. The light beam reflected from the second scale pattern 22 is applied to the light-receiving surface of the second photosensor 3'. The second photosensor 3' generates an encoder signal in the same way as in the fifteenth to eighteenth embodiments described above.

In the present embodiment, the surface emitting laser light source 10 is used as a coherent light source. Any light beam can therefore be emitted from any position desired. The first light beam can be reliably applied, first to the first scale pattern 21 and then to the first photosensor 3. Similarly, the second light beam can be reliably applied, first to the second scale pattern 22 and then to the second photosensor 3'. Thus, the degree of freedom of designing the sensor is greater than in the thirteenth to nineteenth embodiments.

In addition, it is unnecessary to install the beam-splitting means at a specific position. This helps to reduce the cost of installing the beam-branching means.

The present embodiment is advantageous in that no optical energy loss takes place in the beam-splitting means. The embodiment can therefore output a signal having a high S/N ratio.

The components of the twentieth embodiment can, of course, be modified or changed in various ways.

Figure 27:
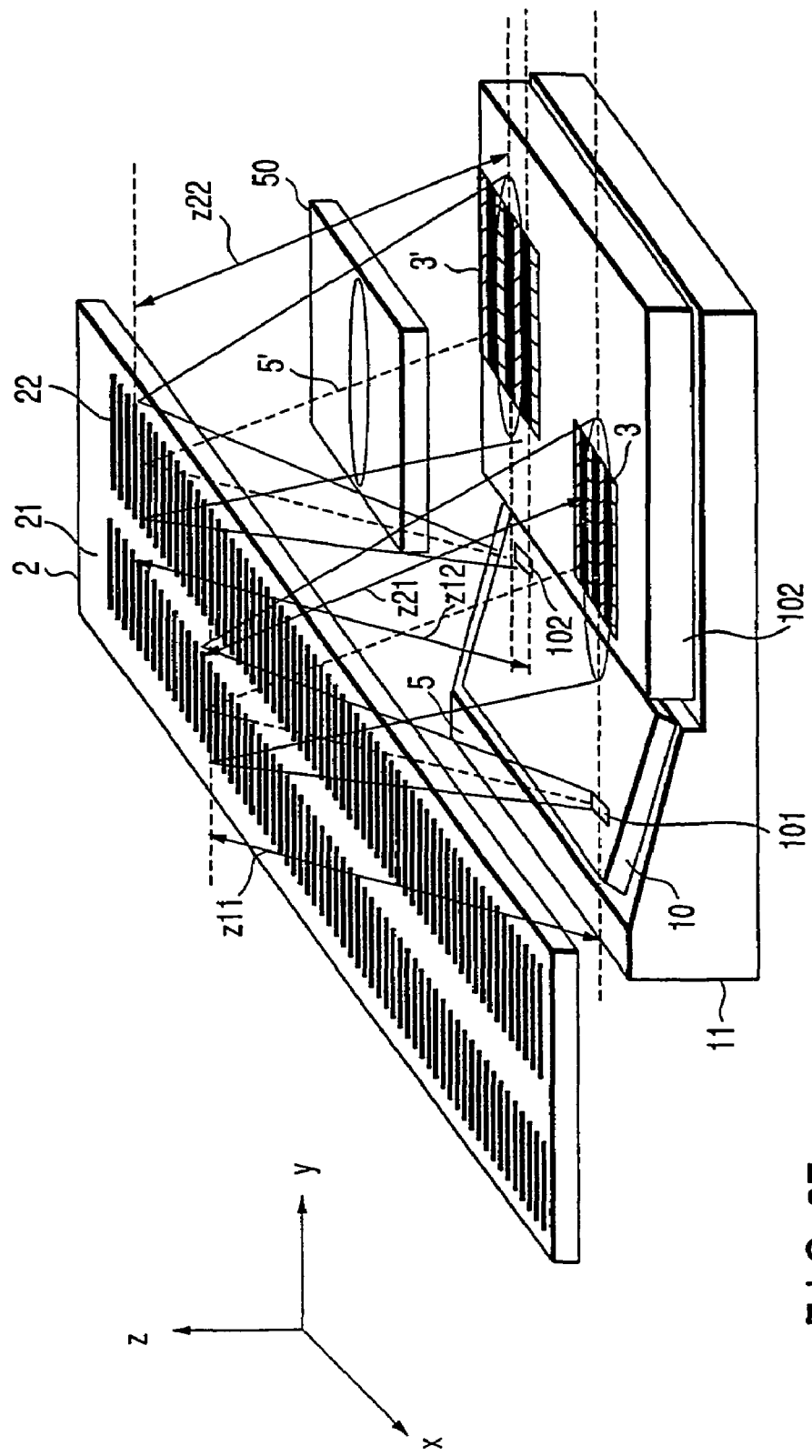
FIG. 27 is a perspective view illustrating the structure of an optical displacement sensor to be used as an optical encoder according to a twenty-first embodiment of this invention.

As shown in FIG. 27, the second scale pattern 22 and the light receiving areas of the second photosensor 3' are formed cyclically, so that detection of the absolute value of the displacement of the scale can be accomplished by the vernier encoder as per the fourteenth or seventeenth embodiment.

Alternatively, an absolute encoder other than the vernier encoder may be realized by providing multiple sets of light beams, scale patterns and photosensors.

When there is some need to adjust the optical distance between the position of the light source and the scale or between the scale and the photosensor, the optical distance adjusting means 50 may be inserted on the optical axis of the light beam to implement optical distance adjustment, as mentioned earlier.

Although the surface emitting laser is used as the light source that can output a plurality of light beams in this embodiment, the type of the light source is not limited to this particular one as long as it can emit a plurality of coherent beams.

(Operation and Effect)

According to one aspect of the present invention, the beam size on the light emitting surface of the surface emitting laser is 3 µm or larger (which was difficult to achieve using the edge emitting type semiconductor laser that had been used in conventional encoders) so as to provide a beam with a small spread angle of less than 20°.

If the spreading of the light receiving areas is limited to the vicinity of the principal axis of the light beam from the light source accordingly, it is possible to set the spread angle of the light beam corresponding to the this narrow spreading of the light receiving areas. This can permit a diffraction interference pattern to be formed on the light receiving areas by effectively using the light beam output from the light source.

This can provide an optical displacement sensor which can output an output signal with an excellent signal amplitude and excellent S/N ratio even if the arrangement of the light source, the scale and the light receiving element is deviated from the optimal one.

According to another aspect of the present invention, a plurality of light beams are irradiated on different areas on the scale, thereby forming a plurality of diffraction interference patterns on different areas on the light receiving surface.

A plurality of light intensity detecting means formed on the photosensor detect the light intensities of specific spatial-phase portions of the respective diffraction interference patterns.

This can ensure reliable isolation of signals from the individual light intensity detecting means as compare with the case where the light intensity detecting means for detecting the light intensities of a plurality of specific spatial-phase portions on the area of a single diffraction interference pattern generated by a single beam.

According to another aspect of the present invention, a plurality of light beams are irradiated on different areas on the scale, thereby forming a plurality of diffraction interference patterns on different areas on the light receiving surface, thus ensuring reliable isolation of signals from the individual light intensity detecting means.

According to the fifth embodiment, the scale has a common diffraction pattern, so that for the individual detecting means to detect the light intensities of specific spatial phase portions of the respective diffraction interference patterns, the light receiving areas that constitute each detecting means should be arranged in a predetermined positional relationship. This makes it inevitable to prepare the light reception patterns again when the pitch of the scale differs.

When there are a plurality of different diffraction interference patterns, by way of contrast, the difference in phase among a plurality of diffraction interference patterns detected by the individual detecting means can be set based merely on the positional relationship among the diffraction interference patterns on the scale. This eliminates the need for changing the arrangement of the light receiving area constituting each detecting means.

According to another aspect of the present invention the scale surface and the light receiving surface of the photosensor are tilted to the principal axis of the light beam which is emitted from the coherent (laser) light source. It is thus possible to prevent the light beam from the laser light source and reflected at the scale or the surface of the photosensor from returning to the light source, thereby suppressing the superimposition of noise caused by the returning laser light on the output signal of the sensor.

This embodiment can therefore ensure scale displacement sensing at higher precision and higher reliability.

According to another aspect of the present invention, the pitch direction of the diffraction grating is arranged in parallel to the light receiving surface of the photosensor, the spatial period of the diffraction interference pattern on the light receiving surface becomes constant, which simplifies the pattern design and layout of the light receiving areas on the photosensor.

With the structure that does not specify the pitch direction of the diffraction grating formed on the scale and the tilt direction of the light beam which goes out from the light source, in general, when the distance between the scale and the light source changes, the diffraction interference pattern on the light receiving surface is shifted in the pitch direction of the interference pattern. It is thus difficult to distinguish this movement from the movement of the diffraction interference pattern on the light receiving surface which is caused by the displacement of the scale in the pitch direction of the diffraction grating on the scale.

By arranging the principal axis of the light beam perpendicular to the pitch direction of the diffraction grating, however, the diffraction interference pattern on the light receiving surface is generated symmetrically to the principal axis of the light beam. Even if the distance between the scale and the light source changes, therefore, the diffraction interference pattern on the light receiving surface does not move in the pitch direction on the principal axis of the light beam.

If a plurality of light receiving areas are formed only in the vicinity of the principal axis of the light beam, particularly, the sensor outputs from those light receiving areas near the principal axis of the light beam are scarcely affected by a change in the distance between the scale and the light source. This makes it possible to accurately detect the displacement of the scale in the pitch direction of the diffraction grating.

It is thus desirable that the surface emitting laser which has a beam spread width corresponding to the distribution of the light receiving areas in the proximity of the principal axis.

The structure which has the light source and the photosensor arranged on the same side with respect to the scale will hereinafter be referred to as a reflection type structure.

According to another aspect of the present invention, the light source and photosensor can be designed compact and integrated, so that the sensor head can be made smaller as compared with the structure which has the scale sandwiched between the light source and photosensor (hereinafter referred to as a transmission type structure).

In the case of the reflection type structure, when the distance between the scale and light source changes, $z1$ becomes $z1+\Delta z$ and $z2$ becomes $z2-\Delta z$.

Let us now consider the case where the scale surface is arranged in parallel to the light receiving surface.

Suppose that the pitch of the interference pattern to be formed on the light receiving surface changes to p2' from p2 when the positional deviation of Δz has occurred. Then, the equation (4) is satisfied for the reflection type structure and the equation (3) for the transmission type structure.

When the aforementioned tilt angle is small, therefore, the reflection type has a smaller difference between the p2 and p2' for the same Δz.

That is, even if the distance between the scale and the light source is shifted, the reflection type structure has advantageously a smaller deviation in the pitch of the diffraction interference pattern.

With z1=z2 under the condition that the equation (1) is met, in particular, the following equation is satisfied, the reflection type has such an advantage that p2 is not affected by Δz.

$$p2'=p2=2p1 \quad (5)$$

According to another aspect of the present invention, the pitch direction of the diffraction grating is arranged in parallel to the light receiving surface of the photosensor, so that the spatial period of the diffraction interference pattern on the light receiving surface is constant, which simplifies the pattern design and layout of the light receiving areas on the photosensor.

With the structure that does not specify the pitch direction of the diffraction grating formed on the scale and the tilt direction of the light beam which goes out from the light source, in general, when the distance between the scale and the light source changes, the diffraction interference pattern on the light receiving surface is shifted in the pitch direction of the interference pattern. It is thus difficult to distinguish this movement from the movement of the diffraction interference pattern on the light receiving surface which is caused by the displacement of the scale in the pitch direction of the diffraction grating on the scale.

If the pitch direction of the diffraction grating is made perpendicular to the principal axis of the light beam emitted from the aforementioned coherent light source, however, the diffraction interference pattern is not shifted on the light receiving surface in the pitch direction in the vicinity of the principal axis even when the distance between the scale and light source changes for the same reason given in the case of the eighth embodiment. This makes it possible to accurately detect the displacement of the scale in the pitch direction of the diffraction grating.

It is thus desirable that the surface emitting laser which has a beam spread width corresponding to the distribution of the light receiving areas in the proximity of the principal axis.

Even if the distance between the scale and light source is changed, this reflection type structure has an advantage that a change in the pitch of the diffraction interference pattern is small.

According to another aspect of the present invention, the light beam may be irradiated to be perpendicular to the surface of the scale. In this case, it should be noted that return light noise is generated by the light that returns to the light source from the scale or the light receiving surface when z1 is small. In the usage where such noise generation is negligible, however, this embodiment has such advantages that even if the distance between the scale and the light source is changed, a change in the pitch of the diffraction interference pattern is smaller, and the positional deviation of the peak of the diffraction interference pattern is smaller, as compared with the transmission type structure used in the prior art.

Even if z1 is small, the noise that is caused by the light returning to the light source from the scale or the light receiving surface is reduced by subjecting the top and bottom surfaces of the scale or the light receiving surface to an optical process of reducing the reflection, this structure can be adapted for any use where the return light noise is negligible.

According to the present invention, the use of the surface emitting laser light source can make the spreading of the light beam smaller and can provide an output signal with an excellent S/N ratio even if the arrangement of the light source, the scale and the light receiving element is shifted from the optimal one.

A beam-splitting optical element may be disposed in such a way as to include the principal axis of the light beam immediately after it has been emitted from the coherent light source and to split the principal axis of the light beam into a plurality of directions only in the plane perpendicular to the pitch direction of the first scale pattern. Even if the spatial gap between the scale and the light source is changed, therefore, the diffraction interference pattern on the light receiving surface is not shifted to the pitch direction of the scale because of the principle that has been explained earlier with reference to FIG. 17A.

This can ensure both the advantage such that an error in positional detection hardly occurs even when the spatial gap between the scale and the light source is changed, and the additional provision of the function to monitor the intensity of the optical output of the coherent light source, the absolute position detecting function, the detecting function based on the reference point pattern, and the like.

The second light beam that has been split by the beam-splitting optical element is irradiated on the second scale pattern, which may have a uniform reflectance, transmissivity or diffraction efficiency.

As the intensity of the light beam that has been reflected at, has passed through or has been diffracted by the second scale pattern is detected by the second photosensor, the function to monitor the optical output of the coherent light source can be realized.

Even if the ambient environment of the sensor is changed, the optical output can be stabilized by feeding the output of the light intensity detecting means comprised of the second photosensor back to the drive means for the laser light source, thus ensuring stable sensing with respect to such a status change.

According to the present invention the number of the tracks of the scale pattern may be increased to increase the number of associated, split light sources and the number of associated photosensors.

The second scale pattern may alternatively have a predetermined period p12 different from that of the first scale pattern, thereby generating a diffraction interference pattern having a spatial period $p2=p12(z11+z21)/z11$ on the light receiving surface on the second photosensor.

As light receiving areas with a spatial period $p22=np2$ are formed on the second photosensor in the x direction, the second photosensor outputs a periodic signal intensity every time the scale moves by p12 in the pitch direction (x direction) of the scale pattern.

Therefore, the intensities of the outputs of the first and second photosensors respectively vary at periods of p11 and p12, the amounts of displacement in the pitch direction of the scale. This can permit addition of the absolute position detecting function within the range of the scale movement which is the least common multiple of p1 and p12 based on the principle of vernier encoder.

The second scale pattern may be a single scale pattern or a plurality of scale patterns formed at a predetermined reference position.

The intensity of the light beam that has been reflected at or has passed through the second scale pattern is detected by the second photosensor.

Because the output of the second photosensor changes only when the second light beam is irradiated on the second scale pattern at the reference point, it is possible to add the function of detecting the reference point with respect to the movement of the scale in the pitch direction.

In the embodiments shown in FIG. 20B and FIG. 24D, all of the beam-splitting optical elements are arranged in such a way as to include the principal axis of the light beam immediately after it has been emitted from the coherent light source and to split the principal axis of the light beam into a plurality of directions only in the plane perpendicular to the pitch direction of the first scale pattern. Even if the spatial gap between the scale and the light source is changed, therefore, the diffraction interference pattern on the light receiving surface is not shifted to the pitch direction of the scale because of the principle that has been explained earlier with reference to FIG. 17A.

The second light beam that has been split by the beam-splitting optical element and irradiated on the second scale pattern having a uniform reflectance, transmissivity or diffraction efficiency, may then be irradiated on a third beam-splitting optical element where its principal axis is deflected again so that the light beam is led to the second photosensor.

As the intensity of the light beam that has been reflected at or has passed through the second scale pattern and has further been deflected by the third beam-splitting optical element is detected by the second photosensor, the function to monitor the optical output of the coherent light source can be realized.

Even if the ambient environment of the sensor is changed, the optical output can be stabilized by feeding the output of the light intensity detecting means comprised of the second photosensor back to the drive means for the laser light source, thus ensuring stable sensing with respect to such a status change.

This aspect of the present invention corresponds to the seventeenth embodiment of this invention.

The embodiment also covers the structure where the number of light beams split and the number of photosensors are increased in accordance with the number of the tracks of the scale pattern.

In the embodiment shown in FIGS. 22A–22C and FIG. 24B, the second light beam split by the beam-splitting optical element is irradiated on the second scale pattern of the predetermined period p12 different from that of the first scale pattern, and is then bended by the first optical beam-bending optical element, thereby generating a diffraction interference pattern having a spatial period $p2=p12(z11+z21)/z11$ on the light receiving surface on the second photosensor.

According to another aspect of the present invention, the first light beam emitted from the coherent light source is irradiated on the first scale pattern, thus forming a diffraction interference pattern having a spatial period $p2=p11(z11+z21)/z11$ on the light receiving surface of the first photosensor.

When the scale is displaced by p11 in the pitch direction of the diffraction grating, the diffraction interference pattern is shifted by $x2=p11(z11+z21)/z11$ on the light receiving surface in the same direction. Therefore, the first photosensor provides an output signal which changes with a periodic intensity every time the scale is displaced by p11 in the pitch direction of the diffraction grating.

The second light beam is irradiated on the second scale pattern and its intensity is detected by the second photosensor which receives the light beam that has been reflected or diffracted by or has passed through the second scale pattern.

By adequately setting the first and second scale patterns, it is possible to achieve the function of monitoring the intensity of the optical output of the coherent light source by detecting the intensity of the light that has been reflected or has passed through the scale having a constant reflectance or transmissivity, the absolute position detecting function by a vernier encoder, the function of detecting the origin based on the reference point pattern, and the like.

Further, two or more of those additional functions can be achieved simultaneously by increasing the number of light beams split and the number of photosensors in accordance with the number of the tracks of the scale pattern.

Although all of the coherent light source, the scale surface and the light receiving surface cannot be arranged in parallel to one another, this structure has such an advantage as to eliminate the need for the beam-splitting optical element and a step of assembling it.

(Effect of the Invention)

As discussed above, this invention can provide an optical displacement sensor, which permits the spread angle of the light beam to be set at an angle not larger than a predetermined small value that cannot be achieved in the conventional semiconductor laser light sources, thereby providing an output signal of a good S/N ratio even when the arrangement of the light source, the scale and the light receiving element is deviated from the optimum one.

As apparent from the foregoing description, this invention can also provide an optical displacement sensor capable of preventing the light beam from returning to the light source, thereby suppressing the superimposition of noise caused by the returning laser light on the output signal of the sensor.

Furthermore, this invention can provide an optical displacement sensor which reduces changes in the period and position of the diffraction interference pattern on the light receiving surface so as to suppress reduction in the signal amplitude and a change in the period with respect to the scale displacement, even when the arrangement of the light source, the scale and the light receiving element is deviated from the designed arrangement.

Moreover, this invention can provide an optical encoder which can be used as an optical displacement sensor, has the reference point detecting function and the absolute point detecting function so as to be able to accurately detect the displacement of the scale in the x direction while being hardly affected by the change in the gap between the scale and the head, and has a structure and means for reducing the assembling cost and for stabilizing the encoder signal output regardless of a change in the ambient environment by employing a mounting mode that does not use an inclined substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical displacement sensor comprising:
a coherent light source which emits a light beam;
a scale which is movable with respect to the coherent light source along a relative movement direction, and which includes a grating pattern formed on a pattern-formed surface thereof to have a predetermined period in the relative movement direction, wherein the light beam is emitted by the coherent light source to the pattern-formed surface along a path which is substantially perpendicular to the pattern-formed surface; and
a photodetector having a light receiving surface which detects movement of a diffraction image of the light beam reflected and diffracted by the grating pattern, said light receiving surface including a plurality of sets of light receiving areas, wherein the light receiving areas in the sets are arranged at intervals of $p2$ in the relative movement direction, and the plurality of sets of light receiving, areas are deviated with respect to each other in the relative movement direction by an odd multiple of $\frac{1}{4} \times p2$;
wherein $$p2 = np1(z1+z2)/z1$$

where:
n is a natural number;
p1 is a spatial period of the grating pattern on the scale;
z1 is a distance along a principal axis of the light beam from a beam emitting surface of the coherent light source to the pattern-formed surface of the scale; and
z2 is a distance from the light-receiving surface of the photodetector to the pattern-formed surface of the scale;
wherein the coherent light source and the photodetector are arranged on a same side of the scale, and the light receiving surface of the photodetector is substantially parallel to the pattern-formed surface of the scale; and
wherein relative movement of the scale with respect to the coherent light source is detected based on an output of the photodetector.

2. The optical displacement sensor according to claim 1, wherein the coherent light source comprises a surface emitting laser.

3. The optical displacement sensor according to claim 2, wherein at least one of the scale surface and the light receiving surface of the photodetector comprises a reflection reduction structure.

4. The optical displacement sensor according to claim 3, wherein the reflection reduction structure comprises one of a reflection preventing film and a surface scattering structure.

5. The optical displacement sensor according to claim 1, wherein the plurality of sets of light receiving areas comprise four said sets of light receiving areas, and the photodetector further comprises an output terminal for monitoring sums of outputs of the four sets of light receiving areas.

* * * * *